: US008415713B2

(12) United States Patent
Ogura

(10) Patent No.: US 8,415,713 B2
(45) Date of Patent: Apr. 9, 2013

(54) PHOTO-FIELD EFFECT TRANSISTOR AND ITS PRODUCTION METHOD

(75) Inventor: Mutsuo Ogura, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/735,795

(22) PCT Filed: Feb. 17, 2009

(86) PCT No.: PCT/JP2009/053117
§ 371 (c)(1),
(2), (4) Date: Aug. 18, 2010

(87) PCT Pub. No.: WO2009/107568
PCT Pub. Date: Sep. 3, 2009

(65) Prior Publication Data
US 2011/0001166 A1    Jan. 6, 2011

(30) Foreign Application Priority Data

Feb. 25, 2008   (JP) .................................. 2008-042461

(51) Int. Cl.
*H01L 31/101*    (2006.01)

(52) U.S. Cl.
USPC ............ 257/187; 257/E31.073; 257/E31.079; 257/E31.082; 257/E31.091; 257/292; 438/74

(58) Field of Classification Search .................. 257/187, 257/E31.073, E31.079, E31.062, E31.091, 257/257; 438/57, 74
See application file for complete search history.

(56) References Cited

U.S. PATENT DOCUMENTS

| 4,904,608 | A | 2/1990 | Gentner et al. |
| 7,759,698 | B2 | 7/2010 | Ogura |

FOREIGN PATENT DOCUMENTS

| JP | H05-343732 | 12/1993 |
| JP | H06-244452 | 9/1994 |

(Continued)

OTHER PUBLICATIONS

Narrow band gap InGaSb, in AIAsSb alloys for electronic devices; R. Magno et al, Naval Research Laboratory, Washington, DC 20375-5347; Received Sep. 14, 2005; Accepted Apr. 10, 2006; Published May 31, 2006); pp. 1622 to 1625; J.Vac. Sci. Technol. B24(3), May/Jun. 2006.

(Continued)

*Primary Examiner* — Julio J Maldonado
*Assistant Examiner* — Amar Movva
(74) *Attorney, Agent, or Firm* — Manabu Kanesaka

(57) ABSTRACT

This invention provides a photo-FET, in which a FET part and photodiode part are stacked, and the FET part and photodiode part are optimized independently in design and operational bias conditions. The semiconductor layer serving as a photo-absorption layer (41) is formed on the cathode semiconductor layer (10) of a photodiode part (50). An electron barrier layer (40) with a wider bandgap semiconductor than a photo-absorption layer (41), which also serves as an anode layer of a photodiode part (50), is formed on a photo-absorption layer (41). The channel layer (15) which constitutes the channel regions of the FET part is formed with a narrower bandgap semiconductor than an electron barrier layer (40) on an electron barrier layer (40). The hole barrier layer (16) with a bandgap wider than the semiconductor which constitutes a channel layer (15) is formed on a channel layer (15). The source electrode (30) and drain electrode (32) which are separated each others, are formed on a hole barrier layer (16). The holes injected into the channel layer (15) by light illumination through the electron barrier layer (40) from the photo-absorption layer (41) are confined with the hole barrier layer (16). And the electrons in a channel layer (15) are confined with the electron barrier layer (40) into the channel layer (15), respectively.

13 Claims, 10 Drawing Sheets

FOREIGN PATENT DOCUMENTS

| | | |
|---|---|---|
| JP | H11-297983 A | 10/1999 |
| JP | 2001-111093 A | 4/2001 |
| JP | 2004-241487 | 8/2004 |

OTHER PUBLICATIONS

High Optical Responsivity of InAlAs-InGaAs Metamorphic High-Electron Mobility Transistor on GaAs Substrate With composite Channels; C.-S. Choi, Student Member, IEEE, H.-S. Kang, Woo-Young Choi, Member, IEEE, H.-J. Kim, W.-J. Choi, D.-H. Kim, K.-C. Jang, and K.-S. Seo; IEEE Photonics Technology Letters, vol. 15, No. 6, Jun. 2003 pp. 846 to 848.

Room-Temperature InAsSb Photovoltaic Detectors for Mid-Infrared Applications; H. Shao, et al; pp. 1756 to 1758; IEEE Photonics Technology Letters, vol. 18., No. 16. Aug. 15, 2006.

A Low Dark Current InGaAs/InP p-i-n. Photodiode with Covered Mesa Structure; Kiyoshi Ohnaka et al; pp. 199 to 204; IEEE Transactions on Electron Device, vol. ED-34, No. 2, Feb. 1987.

PHOTO-FIELD EFFECT TRANSISTOR AND ITS PRODUCTION METHOD

TECHNICAL FIELD

The present invention relates to an improvement and a production method of a photo-field effect transistor (hereinafter referred also as "photo-FET") in which a photodiode (PD) and a field effect transistor (FET) are integrated monolithically.

BACKGROUND ART

Compound semiconductor photodetectors and their arrays have been in high demand as photo-sensing devices for optical communications and spectroscopic systems or infrared cameras in a variety of applications in the fields of medicine, disaster prevention, and industrial inspection, because they have the sensitivity in the near-ultraviolet and near-infrared regions in which silicon photodetectors don't cover.

The photodiode, which comprises the semiconductor p-n junction, is simple in its operating principle and excellent at quantitative performance, however, detection limit of the entire photo-detection system is determined by the noise characteristics of electric amplifiers. Since only one pair of electron and hole is generated with one photon at most, this causes very small current output at weak incident light. Therefore, a photo-transistor has been developed for a compound semiconductor photodetector, which has an internal amplification function.

In the conventional study as disclosed in the following Document 1, optical response of several tens A/W in the 1.5 micron wavelength range is obtained in the response speed of several GHz to several tens GHz for a photodetector for high-speed optical communications when light is irradiated to a HEMT (High electrons Mobility Transistor).

Document 1: C. S. Choi, H. S. Kang, Woo-Young Choi, H. J. Kim, W. J. Choi, D. H. Kim, K. C. Jang, and K. S. Seo, "High Optical Responsively of InAlAs—InGaAs Metamorphic High-electrons Mobility Transistor on GaAs Substrate with Composite Channels", IEEE Photonics Technology Letters vol. 15 No. 6 (2003) p. 846-p. 848

Moreover, as disclosed in the following Document 2, the structure in which slow holes are discharged preferentially has also been developed in order to improve the response speed of the device. However, when holes are discharged intentionally, there are some issues on reduced sensitivity and restrictions of the photo-sensitive area near the FET gate.

Document 2: JP-A H05-343732

Furthermore, the study to use a heterojunction bipolar transistor (HBT) as a heterojunction bipolar photo-transistor (HPT) has also been made since 1980s. In the HPT, electron current is injected into the base region from the emitter region until it acquires the recombination rate equal to the amount of injected holes as the base current, and the ratio between electrons and hole current is equivalent to the current amplification factor. In this case, it is important to obtain the high current amplification factor that a barrier to the electrons and holes exists at the boundary of the base and the wide bandgap emitter region, the barrier in the valence band to the hole is large enough, the transfer of the holes to the emitter region is impeded, and the height of the conduction band barrier to the electrons is lowered upon light irradiation.

Although HPT has an advantage of high gain with a simple structure, it is necessary to set up the base bias voltage through a high resistance element in order to make up the matrix switch for the pixel selection because the sensitivity to light will disappear if the base is set to a fixed voltage.

It is a common practice to take several seconds to several minutes in order to perform the accurate measurement in physical and chemical science. Moreover, integration time of 1/30 second per one visible frame is required for each pixel in an image sensor, which is comparatively long. Thus, a highly sensitive device with a structure feasible for high-density integration is more preferable than a high speed device for a large majority of applications except for the purpose of optical communication.

The present inventors have already disclosed the photo-FET, which combined a pin photodiode and a FET in the Document 3 (PCT/JP2007/052913). As for the photo-FET disclosed in this Document 3, an integration time and a large gain suitable for instrumentation measurement and image pick-up applications can be ensured by accumulating the holes intentionally in return for the reduction of the response time to tens of KHz. The structure of this device is briefly illustrated in FIG. 14. The channel layer 150 used as the current path between the source electrode 300 and the drain electrode 320 of the FET built on the semi-insulating substrate 100 functions as a cathode and photosensitive region of a photodiode. And the back gate 130, which comprises the semiconductors of reversed polarity with the channel layer 150, functions as an anode of the photodiode. The source electrode 300, the drain electrode 320, and the gate electrode 310 disposed between them are placed on the barrier layer formed on the channel layer 150. The gate electrode 310 is disposed on the surface-side-depletion-layer forming layer 210 to form a p-n junction gate further, and the depletion layer 340 is extended to the channel-layer area under this layer 210.

Document 3: International Publication (WO) No. 2007/094493

In the prior art, a focal plane array (FPA: Focal Plane Array) structure has been adopted in a compound semiconductor infrared image sensor in which a two-dimensional charge amplifier array of a silicon integration circuit and a compound semiconductor two-dimensional photodetector array are bonded together. However, FPA has a disadvantage that it requires a difficult process of bonding a thin-sliced pin photodetector array and a silicon amplifier array to dispose each element of read-out charge-amplifiers and pin photodetectors arranged in two dimensions. Moreover, there are some other issues such that a two-dimensional charge amplifier array becomes large scale in total and that the area of amplifiers assigned to each cell is restricted. This makes the advanced signal processing difficult.

On the other hand, in the structure shown in Document 3, the photo-FET array is also disclosed wherein a FET is formed in each cell. It allows the output of the selected cell to be cut off by turning the bias of the FET gate to negative. Therefore, read-out of the two dimensional pixels is enabled by selecting each column with a planar hybrid module using a one-dimensional charge amplifier array. Furthermore, while holes are injected inside the channel layer 150 from the back gate 130 as minority carriers under illumination, these holes are accumulated inside the channel 150 since the preferential barrier layer 160 to these holes is disposed. Responding to this, the amount of electrons equivalent to the number of the accumulated holes inside of the channel is induced to fulfill the charge neutrality conditions inside of the channel. In fact, the electrons induced in this photo-FET is injected from the source electrode 300 through the barrier layer 160 that is penetrable to the electron, and is discharged to the drain electrode 320 through the channel layer 150. In other words, 10,000 to 100,000 times as many electrons, which is equivalent to the sojourn time of the holes divided by the transit time of the electrons, run inside the channel layer 150 against one hole, and high amplification performance can be achieved, which could not be obtained with the conventional devices.

Furthermore, in the photo-FET indicated in Document 3, the electric current proportional to the amount of the excited holes can be acquired, and photoinduced current can be amplified for a wide range of the light intensity from femto-watt (fW) level to milli-watt (mW) level. Thus, high sensitivity and wide photosensitive spectra can be ensured with this photo-FET structure. Furthermore, it also becomes possible to add the addressing function of the two-dimensional matrix when the depletion layer 340 is controlled with the gate voltage applied to the gate electrode 310.

On the other hand, as shown in the following Document 4, in the monolithic optical IC in which the output of a pin photodiode is inter-connected to the gate of the FET, the bias circuits using resistors or such kinds are required to ensure both the gate-bias conditions for the optimum FET gain and the photodiode bias-voltage simultaneously. Moreover, second epitaxial growth is preferable to form FETs on the semi-insulating substrate and to form photodiodes with sufficiently thick photo-absorption layer on the same substrate.

Due to such complicated fabrication processes and design to ensure the optimum operating conditions, apparent advantage has not been recognized in the monolithic optical ICs over the hybrid case when individual FET and photodiode fabricated on the different substrates are interconnected with wire bonding techniques.

Document 4: JP-A H06-244452

As another conventional structure device shown in the following Document 5, a threshold voltage modulation image Sensor (VMIS) has been developed as the advanced type of the silicon CMOS image sensor. In this device, a highly sensitive photodetector can be realized by applying the output voltage of a photodiode as the back gate voltage of MOSFET through the p-channel well. However, this is the structure functional only with the lateral doping profile realized by the ion implantation technique, and it is hard to apply in the compound semiconductor device process technology using a semiconductor hetero-structure because the annealing process after ion implantation induces crystal defects and inter-mixing of the hetero-interfaces.

Document 5: JP A 2004-241487

On the other hand, in the photo-FET shown in the above Document 3, an FET and photodetector are integrated on the same substrate with a relatively simple fabrication process of etching and electrode formation only. And, a highly sensitive photodetector can be fabricated without losing the electronic characteristics of the laterally uniform compound semiconductor epitaxial layer.

When looking into the structure where the output of a photodiode is connected to the back gate of FET, it is also important to improve the performance of the photodiode because the noise generated in the photodiode part will be amplified in the FET part as it is. In the general classification of conventional photodiode, there are mesa type and planar type. With mesa type, a p-n junction is formed with crystal growth in advance, and then, a required device region is to be formed by etching. With planar type, impurities are selectively induced from the n-type epitaxial layer surface, and the part of the anode side is reversed to p-type. Although the mesa structure has an advantage in reducing the device size and floating capacitance, which is suitable for high-speed photodetectors, there is an issue of large surface leak current at the p-n junction exposed at the mesa sidewall. On the other hand, the planar type has an advantage of suppressed surface leak current since the p-n junction containing a photo-absorption layer is not exposed to the surface.

In general, the crystal surface has large crystal defect density as compared with the inside of a crystal. Therefore, the recombination current will become serious in case when the photo-absorption layer with a narrow bandgap is exposed to the surface and kept at the depletion condition. Therefore, dark current can be suppressed by forming the air-exposed p-n junction with the wide energy bandgap semiconductor by selective diffusion of impurities from the wide energy bandgap cap layer.

Also as for the mesa type photodiode, as shown in the following Documents 6 and 7, there are some inventions to suppress the dark current by selective impurity diffusion surrounding the whole mesa structure and the part of the wide bandgap semiconductor layer at the bottom of the mesa structure. The mesa structure is comprised of a photo-absorption layer with the narrow bandgap semiconductor layer on the wide bandgap semiconductor layer as in Document 6. Or, as shown in the following Document 7, the photo-absorption layer comprised with the narrow bandgap semiconductor layer is sandwiched with the wide bandgap semiconductors up and down.

Document 6: Kiyoshi OHNAKA, Minoru KUBO, and Jun SHIBATA, 'A Low Dark Current InGaAs/InP pin Photodiode with Covered mesa Structure', IEEE Transactions on electrons Devices, Vol. ED-34, No. 2, February 1987, p. 199-204

Document 7: U.S. Pat. No. 4,999,696, FIG. 1b

It is sure that dark current can be suppressed if a Zn diffused layer is extended to the surface of a lower InP layer and if the p-n junction exposed to the surface is limited to the InP layer with wide bandgap energy. Moreover, as for the mesa structure, the cross talk between each element in the array type detector is also suppressed because the photo-absorption layer can also be separated physically for every one device.

Among such conventional prior art, there are various advantages over the other former devices in the photo-FET of shown in the previous Document 3. However, some issues on the design and processes have been still recognized. For example, in the photo-FET disclosed in this Document 3, the channel 150 of FET functions as the cathode of the photodiode, and the back gate 130 of FET functions as the anode of the photodiode, respectively, at the same time. And the source electrode 300 of FET and the anode potential of the photodiode, i.e., the electric potential of the back gate layer 130, are interconnected through the channel layer 150. Therefore, it is difficult to optimize the device configuration and operation conditions as an amplifier and also to optimize these as a photodiode, respectively. For example, bias voltage for the photodiode part is not controllable from the outside.

To be specific, it is desirable that the source electrode 300 and the drain electrode 320 be formed on a highly-doped, narrow bandgap n-type InGaAs layer, for example, in order to decrease the parasitic resistance as FET. On the other hand, the top surface should be a window material as a photodiode, for example, an InP or InAlGaAs layer, which is transparent for the wavelength band of the incident light since it is not desirable that a photo-sensitive surface is covered with a narrow bandgap material.

Moreover, since the channel layer 150 of the FET is shared with the cathode of the photodiode, there is a tendency that the photoinduced signal from the photodiode is not effectively transmitted to the FET. The cathode conductivity of the photodiode tends to reduce simultaneously when the carriers concentration of the channel is lowered for securing the normally-off conditions in order to suppress the dark current level. Therefore, there was a problem of the material design that the optimum range of the doping concentration of the channel layer 150 becomes narrow.

Furthermore, there is also another problem. It is desirable for the FET that the short channel FET structure, which shortened the distance between the source and the drain electrodes (300, 320), should obtain a high transconductance (gm) FET and should be driven with relatively low source drain voltage no more than 0.5V in order to suppress the dark current (the leakage current without illumination) induced by impact ionization. On the other hand, the applied bias voltage of more than 1 to 2V is usually desirable for the photodiode to extend its depletion layer to some extent and to drift the photoinduced carriers. However, since the photodiode is serially-cascaded to the source drain of the FET inside this photo-FET device, the voltage between the anode and cathode of the photodiode will be always set lower than the bias voltage between the source and drain of the FET. Therefore, it becomes the issue that neither the gain of the photo-FET nor the suppression of the dark current is sufficient. The depletion layer will not fully spread in the photodiode when the bias voltage of the FET is restricted to induce the range of the electric field where impact ionization will not take place.

Moreover, the gain of FET will drop in case the injected holes are recombined at the air-exposed mesa sidewall of the FET part constituting the photo-FET. The generation of minority carriers becomes serious at the air-exposed mesa sidewall of the photodiode part if a depletion layer exists in the narrow bandgap photo-absorption layer.

The present invention mainly aims to solve these issues of suppressing the dark current in the photodiode part and the reduction of gain in the FET part by providing the new photo-FET with the optimum design for the FET part and the photodiode part, respectively, and by enabling the application of independent bias voltage for each part.

DISCLOSURE OF THE INVENTION

In order to satisfy the above-mentioned object, the present invention provides a photo-FET comprising, at least:

a semiconductor layer as a fundamental structure, which is formed on the cathode semiconductor layer as the cathode of the photodiode part, and which works as the photo-absorption layer of the photodiode part;

an electron barrier layer with a wider bandgap semiconductor layer than the photo-absorption layer, which is formed on the photo-absorption layer, and which also comprises the anode layer of the photodiode part;

a channel layer with a narrow bandgap semiconductor, which is formed on the electron barrier layer, and which constitutes the channel region of the FET part;

a hole barrier layer, which is formed on the channel layer, and which comprises the semiconductor with bandgap wider than the channel region;

a source electrode and a drain electrode, which are formed on the hole barrier layer and separated each other, wherein the photoinduced holes at the photo-absorption layer injected into the channel layer through the electron barrier layer are confined at the channel layer by the hole barrier layer, and also, the electrons inside the channel layer is confined by the electron barrier layer.

Implementing this fundamental configuration, the present invention also provides a photo-FET in which the impurity diffusion layer is formed with impurity of reverse conductive polarity at the exposed sidewalls of the channel layer and the part of the electron barrier layer under the mesa structure enclosing this mesa structure.

The present invention provides another photo-FET in which:

a cathode semiconductor layer has a bandgap wider than the photo-absorption layer;

an electron barrier layer and a photo-absorption layer are formed into the second mesa structure, and its sidewall is exposed; and the impurity diffusion layer is formed with impurity of reverse conductive polarity of the photo-absorption layer at the air-exposed sidewalls of the second mesa structure and a part of the cathode semiconductor layer enclosing the second mesa structure.

As the lower conceptual structure, in the specific embodiment of the present invention, it discloses a photo-FET in which the cathode semiconductor layer is an n-type semiconductor layer, the photo-absorption layer is an n-type or a non-doped semiconductor layer, the electron barrier layer is a p-type semiconductor layer, the channel layer is an n-type or a non-doped semiconductor layer, and the hole barrier layer is constituted with an n-type or a non-doped semiconductor layer.

It also proposes another type of photo-FET in which the photo-absorption layer is an n-type or non-doped semiconductor with p-type doped at the surface, and the electron barrier layer located next to the surface of this photo-absorption layer is non-doped.

Also in any embodiment of the present above-mentioned invention, the cathode semiconductor layer can be formed in order to include the substrate, the buffer layer formed on this substrate, and the step graded layer, which is formed on the buffer layer and facing the electron barrier layer.

Moreover, the channel layer can also be formed to include the following three-layer structure: a step graded layer in contact with the electron barrier layer, a main channel region on this step graded layer, and another step graded layer on the main channel region under the hole barrier layer.

Although the photo-FET in the present invention does not require a gate electrode for the most fundamental configuration, if necessary, either a p-n junction type or Schottky junction type gate electrode may be formed between the source and drain electrodes.

As for the configuration of the photo-FET in the present invention, the area of the channel layer can be formed smaller than the photo-absorption layer in plan view. As for the electrode arrangement, a source and a drain electrode are formed concentrically, and also, a source electrode, a gate electrode, and a drain electrode can be arranged concentrically in case the gate electrode is formed.

The present invention can also be specified also as an invention concerning the production method. That is, the production method of the photo-FET in which a FET part is stacked on a photodiode part can be proposed by the steps of:

epitaxial-growth in order;

a semiconductor part constituting a photo-absorption layer of a photodiode part on a cathode semiconductor layer constituting the cathode of the photodiode part;

an electron barrier layer above this photo-absorption layer, which will be a semiconductor layer with a bandgap wider than the photo-absorption layer and serve as the anode layer of the photodiode part as well;

a channel layer above this electron barrier layer, which will be a semiconductor layer with a bandgap narrower than this electron barrier layer and constitute a channel region of the field effect transistor part; and a hole barrier layer on this channel layer comprising a semiconductor with a bandgap wider than the semiconductor constituting the channel layer;

forming source and drain electrodes on the hole barrier layer which are isolated; and cutting the above-mentioned channel layer into the specified configuration by using the electron barrier layer as an etching stopper.

Effect of Invention

The effect of the present invention is profound, and many advantages can be provided as compared with the conventional technologies.

Also as for the conventional pin-type photodiode, although it is possible to control the equivalent noise power of the diode below several tens fW/root Hz (fW/$\sqrt{Hz}$) level by cooling, the equivalent noise power as the entire optical detection system is restricted by the additional noise induced by an external amplifier. On the other hand, in the photo-FET of the present invention, the configuration is equivalent to the output of the photodiode interconnected to the monolithically formed FET without wiring. The gain of the FET part becomes as much as 10,000 to 100,000 times, which is equivalent to the hole lifetime in the FET channel divided by the electron transit time. Thus, the gain of the FET part becomes stable because it is determined by the physical properties of the electron and holes. And by setting the doping of the channel layer low, it can amplify an incident light for a wide dynamic range of several decades in the intensity from a very weak level without changing the external detector circuit.

With the present invention, electrons in the channel layer can also be confined by the electron barrier layer while holes injected through the electron barrier layer from the photodiode part are confined in the channel layer by the hole barrier layer. Because electrons are passing through the channel while holes are accumulated in the channel, the photo-FET with a larger amplification factor is realized compared with that of the conventional devices, which is equivalent to the hole lifetime divided by the electron transit time. Moreover, suppression of the dark current and the amplification factor can be optimized independently by adjusting the bias of the photodiode part and FET part independently.

In the specific embodiment of the present invention, the photo-FET is provided wherein the impurity diffusion layer is formed to dope the impurity of the reverse polarity of the channel on the exposed sidewall of the channel layer formed underneath the mesa structure and on the part of the exposed surface of the electron barrier layer under the mesa structure, enclosing this mesa structure.

And the other photo-FET is provided wherein the impurity diffusion layer is formed to dope the impurity of the reverse polarity of the photo-absorption layer on the exposed sidewall of the electron barrier layer, photo-absorption layer, and on the part of the exposed surface of the cathode semiconductor layer formed underneath the second mesa structure enclosing the second mesa structure.

As for such photo-FETs, a wide bandgap semi-conductor is restrictively employed for the p-n junction exposed at the sidewall of each layer. In general, in the InGaAs/InP-pin photodiode of several tens micrometers diameter, the leakage current of a planer diffusion type photodiode is suppressed as much as several tens times in comparison with that of a mesa type. And also as for a photo-FET, because the noise components of the dark current in the photodiode part determines the detection limit of the device, it becomes possible to improve the detection sensitivity drastically by removing the p-n junction comprised of a narrow bandgap semiconductor exposed to the surface, which causes a major source of the surface leak current by diffusing the impurity from the exposed sidewall of the p-n junction including the wide bandgap semiconductor at the surface.

Moreover, as for the specific embodiment of the present invention in which the size of the channel layer of the FET part is configured smaller than that of the photo-absorption layer of the photodiode part, the drift field is formed against holes from the surrounding area to the source by setting the cathode voltage positive against the drain voltage. The increase in the hole current, i.e., the increase in sensitivity and amplification factor, can be achieved as well because all the holes generated in the photodiode concentrate into the channel region of the small FET part. Since the size of the electron barrier layer surrounding the channel layer also becomes wide, which serves as a photo-sensitive surface, it is possible to provide the photo-FET, which employs the opaque materials optimized for the FET part independently without significant decrease in the photo-sensitive area.

With the photo-FET in another embodiment of the present invention, since the source and drain electrode or the source, gate, and drain electrodes are arranged concentrically, the local electric field concentrations and resultant increase of the dark current are avoided. In addition, holes can be accumulated in the center of the FET part and the amplification effect of the FET can be enhanced if the source electrode is kept at lower electrostatic potential than the drain electrode.

Also as for the production method of the photo-FET, according to the present invention, at least up to the hole barrier layer can be fabricated by one consecutive epitaxial growth of the MOCVD and so on, and etching process can be performed using the electron barrier layer as an etching stopper when patterning each area after the growth. Such production method is simple and the improvement in the yield can also be expected.

DETAILED DESCRIPTION OF PREFERRED EMBODIMENTS

The desirable embodiment of the present invention is provided in FIG. 1 and subsequent figures.

Through all the figures, the same symbol and numbering correspond to the same or similar components. Therefore, in each explanation along with each figure among this patent description, when there is no description of the component with symbols in the figure, the description of the component with the same symbol provided in the other figures may be used alternatively.

Figure 1A:
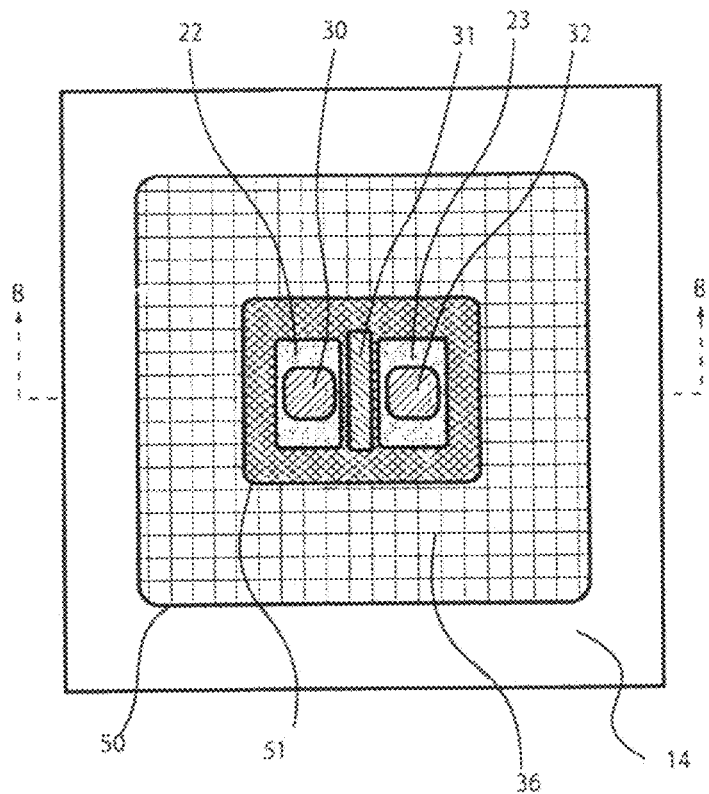
FIG. 1(A) is a plan view of the first embodiment of the present invention.
Figure 1B:
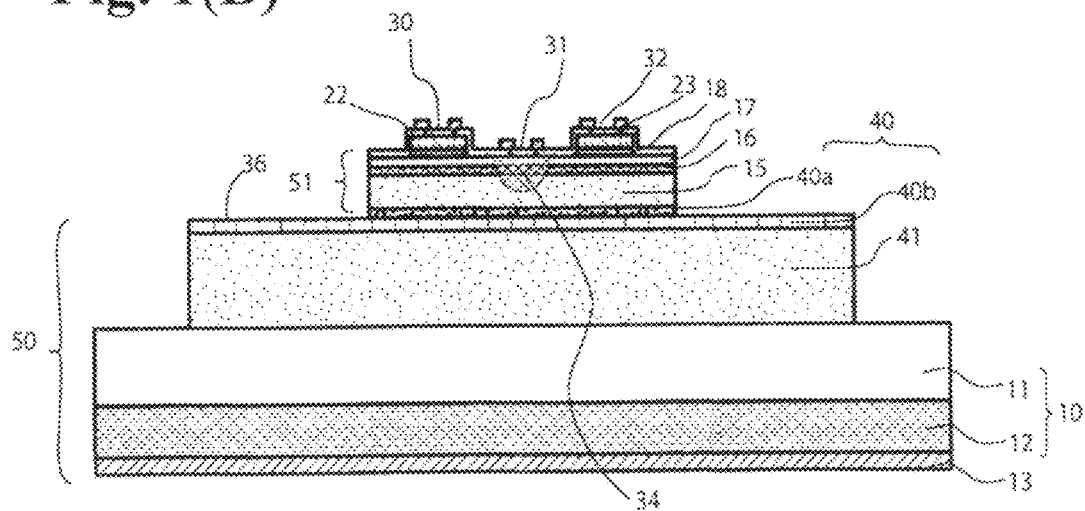
FIG. 1(B) is a cross-sectional view along the line B-B in FIG. 1(A).

First, FIGS. 1(A) and 1(B) show the plan and cross-section view of the photo-FET structure as the fundamental embodiment constituted according to the present invention. This photo-FET of the present invention comprises the photodiode part 50 and the FET part 51. Firstly, the cathode semiconductor layer 10 serving as the cathode of the photodiode part 50 is constituted with the n-type semiconductor substrate 12, and with the buffer layer 11 of a low concentration n-type semiconductor layer formed above the substrate as required. On this cathode semiconductor layer 10, the photo-absorption layer 41 comprising a low-concentration n-type or a non-doped semiconductor is stacked, and also the electron barrier layer 40 comprising the semiconductor layer with the bandgap wider than the photo-absorption layer 41 is stacked, which becomes the anode of the photodiode part 50 as well. This electron barrier layer 40 is doped into p-type so that the pn or pin photodiode part 50 is constituted. The electron barrier layer 40 may be divided into a p-InAlGaAs layer 40a and p-InP layer 40b etc. for the production convenience or to improve the performance as an electron barrier. The existence of this electron barrier layer 40 is the characteristic structure of the present invention, and it serves a very important role as mentioned afterward.

On the electron barrier layer 40, the channel layer 15 is formed, which comprises the n-type or a non-doped semiconductor with the bandgap narrower than this electron barrier layer 40, and constitutes the channel region of the FET part. On this channel layer 15, the hole barrier layer 16 is formed, which comprises the n-type or non-doped semiconductor with the bandgap wider than that of the channel layer 15. Furthermore, the Schottky barrier layer 17 and the etch stop layer 18 are also formed as required. The hole barrier layer 16 collaborates with the electron barrier layer 40 and serves an important role as mentioned afterward. Above this, the source electrode 30 and the drain electrode 32 are formed and aligned to each other with a space, and the gate electrode 31 is formed on the Schottky barrier layer 17 between them. The Schottky barrier layer 17 also turns into a layer, which generates the surface side depletion layer 34 in this structure. In addition, since the size of the channel layer 15 is smaller than that of the photo-absorption layer 41 in planar view, the surrounding area of the channel layer 15 becomes a photosensitive surface 36, which is sufficiently wide at the surface of the electron barrier layer 40.

Figure 2:
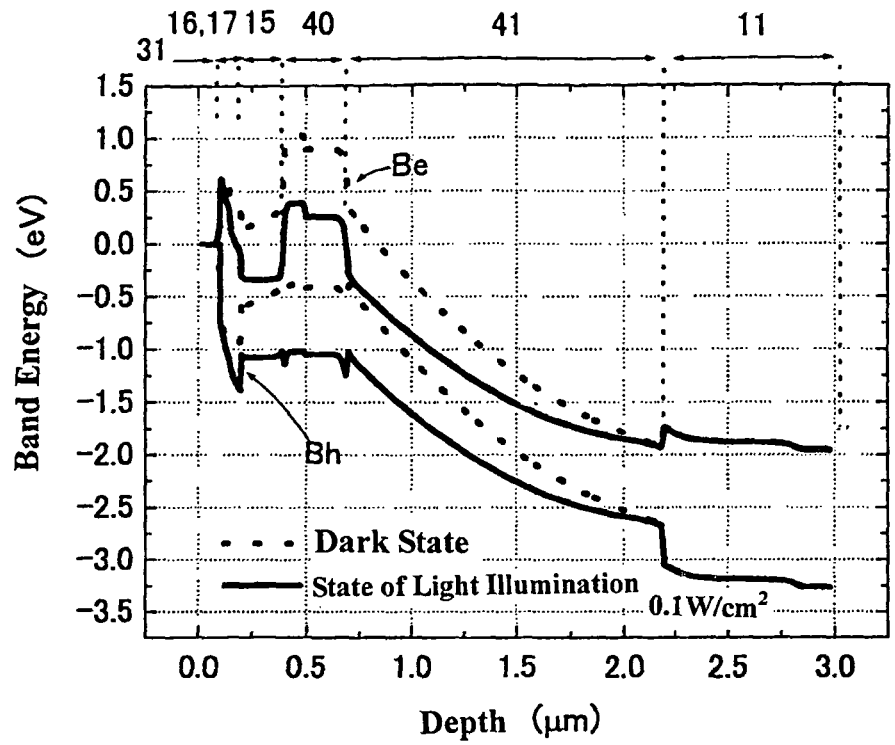
FIG. 2 is a drawing of a band profile before and after the light illumination of a photo-FET shown in FIGS. 1(A) and 1(B).

In FIG. 2, the band profile of before and after light illumination of the photo-FET in the fundamental embodiment of the present invention is shown. In this figure, the solid line indicates the band profile at the light illumination of 0.1 W/cm$^2$, and the broken line indicates the band profile without light illumination. An InGaAs/InAlGaAs/InGaAsP/InP material system, which is mentioned later, is used as concrete material parameters for performing the simulation. The gate and source voltages are set to 0V, the drain voltage is set to 1V, and the cathode electrode is set to 2V, respectively. The hole barrier layer 16, which comprises the n-type InP, the Schottky barrier layer 17, which comprises the InAlGaAs, and the gate electrode 31 are formed on the surface side of the non-doped InGaAs channel layer 15. On the other hand, at the boundary of the substrate side of the channel layer 15 that is the boundary with the photo-absorption layer 41, the electron barrier layer 40, which comprises the p-type InAlGaAs layer 40a and p-type InP layer 40b, is formed. As for electrons in the channel layer 15, the band profile, which has a barrier Be against electrons at the conduction band, is formed between the channel layer 15 and the photo-absorption layer 41. And, as for the holes, the hole barrier layer 16 is formed between the Schottky barrier layer 17 and the channel layer 15, and the band profile is formed with the barrier Bh against the holes at the valence band (FIG. 2).

Therefore, when a positive bias voltage is applied to the cathode electrode 13 against the source electrode 30, the electrons in the channel layer 15 are accelerated toward the substrate 12 side by a drift field, and the holes are accelerated towards the surface side by a drift field, respectively. The electrons are blocked with the electron barrier layer 40, which is formed at the boundary of the photo-absorption layer 41 and the channel layer 15. Holes are also blocked with the hole barrier layer 16 formed at the boundary of the channel layer 15 and the FET electrode. And they are confined in the channel 15 altogether.

Therefore, the holes, which are generated at the photo-absorption layer 41 by light illumination, are injected to the channel layer 15 from the electron barrier layer 40, which also works as the anode of a photodiode, and confined in the channel layer 15 by the hole barrier layer 16 when a positive bias voltage is applied to the cathode semiconductor layer 10 (substrate 12). At the same time, when holes are injected into the channel layer 15 while the whole band profile of the channel layer 15 lowers by about 0.5 eV, electrons are injected from the source electrode 30 in order to compensate the injected hole charge and satisfy the charge neutrality conditions.

In general, materials with a large offset in the conduction band is preferable for the electron barrier layer, and those with a large offset in the valence band is preferable for the hole barrier layer 16. InAlGaAs and InP are suitable, respectively, when an InGaAs is used for the photo-absorption layer 41, which is lattice-matched to InP as the substrate 12. In addition, in order to make a selective etching process possible or in order to form a Schottky contact, it is effective to choose an InAlGaAs/InP stacked layer structure layer as the electron barrier layer 40 and to choose an InP/InAlGaAs stacked layer structure as the hole barrier layer 16. Moreover, in order to reduce the crystal defect density or discontinuity at the hetero-interface, it is also effective to form the graded layer by InGaAsP at the boundary of the photo-absorption layer 41 and the electron barrier layer 40.

It was also possible to modulate the potential of a FET channel through the back-gate-bias effect as it is applied in the VMIS structure; however, the transmission efficiency of the charge is deteriorated by the surrounding parasitic capacitance. On the other hand, more efficient modulation of the channel conductivity is enabled with the present invention by injecting holes directly to the inside of the channel layer. That is, 'current driven bipolar FET' is realized as a completely new current amplification device. The characteristic structure of the present invention, which brings about such performance, is based on that the FET part 51, which is near the center of the device, and pn photodiode part 50 are separated through the electron barrier layer 40.

Figure 3:
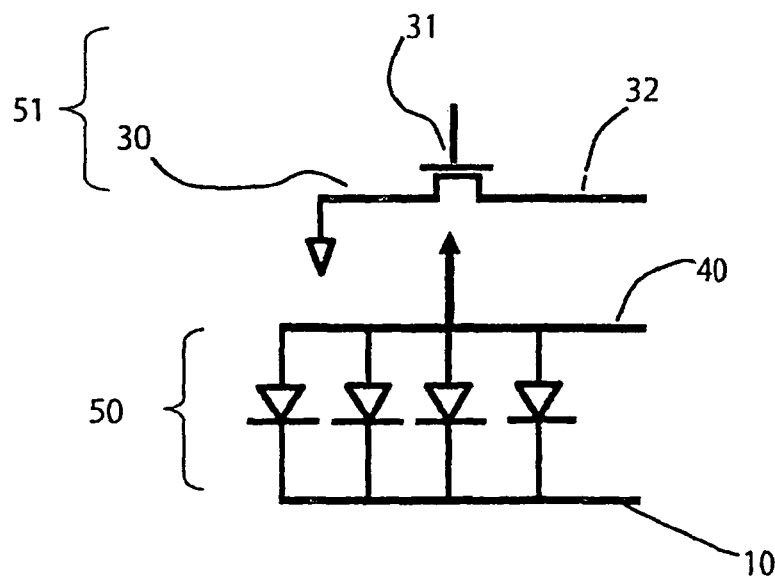
FIG. 3 is an equivalent circuit schematic of the photo-FET of the present invention.

FIG. 3 shows the equivalent circuit of the photo-FET of the present invention, and the bias conditions are the same as the band profile shown in FIG. 2. A bias voltage higher than a drain voltage (by about 2V) is applied to the cathode semiconductor layer 10 of the photodiode part 50 beforehand. About 1V is applied to the drain electrode 32 while the source electrode 30 is grounded, and 0 or about −0.5V negative bias is applied to the gate electrode 31 so that the FET channel 15 may be depleted according to the doping concentration of the hole barrier layer 16. Among the electron-hole pairs generated at the photodiode part 50 by light illumination, the holes are accelerated toward the FET side and injected into the FET channel-layer 15 through the electron barrier layer 40 serving as the anode of the photodiode part 50. By employing such structure, it becomes possible to apply the optimum bias voltage between the cathode semiconductor layer 10 and the source electrode 30 independently to the source and drain voltage, as it is clearly depicted in the equivalent circuit.

According to the photo-FET disclosed in Document 3 as a prior art, although it depends also on a carrier concentration profile and a device size, since the breakdown voltage between the anode and cathode of the pn photodiode is larger than the bias voltage in which the impact ionization may generate between the source and drains of the FET, the superfluous dark current is induced between the source drain region, which caused lowering of the sensitivity when sufficient bias voltage is supplied between the anode and cathode. On the other hand, in the present invention, since bias voltage can be applied independently as mentioned above, the bias voltage of the photodiode part 50 can be set larger than the bias voltage between the source and drain region of the FET part 51.

Moreover, at the photo-FET of the present invention, since the anode layer 40 and the cathode semiconductor layer 10 of the photodiode part 50 can be comprised of sufficiently highly doped p-type and n-type semiconductor as well as a usual pn photodiode, there is no limit in the photodiode area. Thus, the electrons and holes generated by light illumination are transferred for several micrometers along the thickness direction of the device towards the anode 40 and the cathode semiconductor layer 10 by drift or diffusion mechanism, respectively, and laterally transferred as a majority carrier current almost without attenuation. Therefore, it is also possible to form a photodiode part with relatively large photo-sensitive area of several millimeters or more in diameter, which is comparable to that of the photo-multiplier.

Furthermore, in the case of the conventional FET in which the photodiode output is inter-connected to the gate as an input, electrostatic capacitance of a photodiode and that of the surrounding structure screens the photoinduced charge and brings about the deterioration of the sensitivity. As for the current-injection type photo-FET according to the present invention, amplification function, which is independent of the device configuration, is ensured by introducing the photoexcited current generated at the photodiode into the channel layer 15 directly as a minority carrier. As for an optical detector, the stability and precision of the sensitivity are important performance indices. The current output of the current-injection type photo-FET is mostly proportional to the photoinduced current of the photodiode part as it will be mentioned later, and calibration of the sensitivity is rather easy.

Figure 4A:
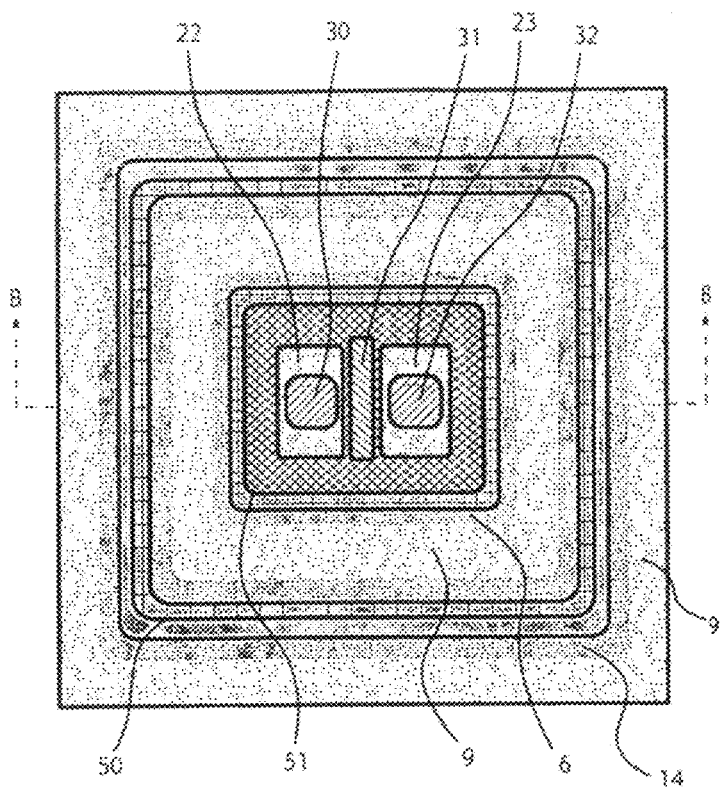
FIG. 4(A) is a plan view of another embodiment of a photo-FET of the present invention, which is comprised of InGaAs/InAlGaAs/InP material system and suppresses a surface leak current at exposed sidewalls of the mesa structure.

FIGS. 4(A) and (B) illustrates another type of the photo-FET in which the exposed sidewall of the mesa structure of the FET part 51 are doped by impurities, and a conductivity type is inverted in the fundamental photo-FET shown in FIGS. 1(A) and (B). For example, compared with the fundamental photo-FET structure of FIGS. 1(A) and (B), the diffusion layer 6 converted into the p-type, which is the opposite polarity to the channel layer 15 and the same polarity as the electron barrier layer, is formed with thermal diffusion of the dopant, such as zinc (Zn) etc. along the mesa sidewall of the channel layer 15 in the first mesa structure 51 that constitutes the FET part 51 from the electron barrier layer 40b through the SiN$_x$ diffusion mask 9 with a predetermined window pattern. This diffusion layer 6 is formed also along the part of the exposed surface of the electron barrier layer 40b enclosing the first mesa structure 51.

Figure 4B:
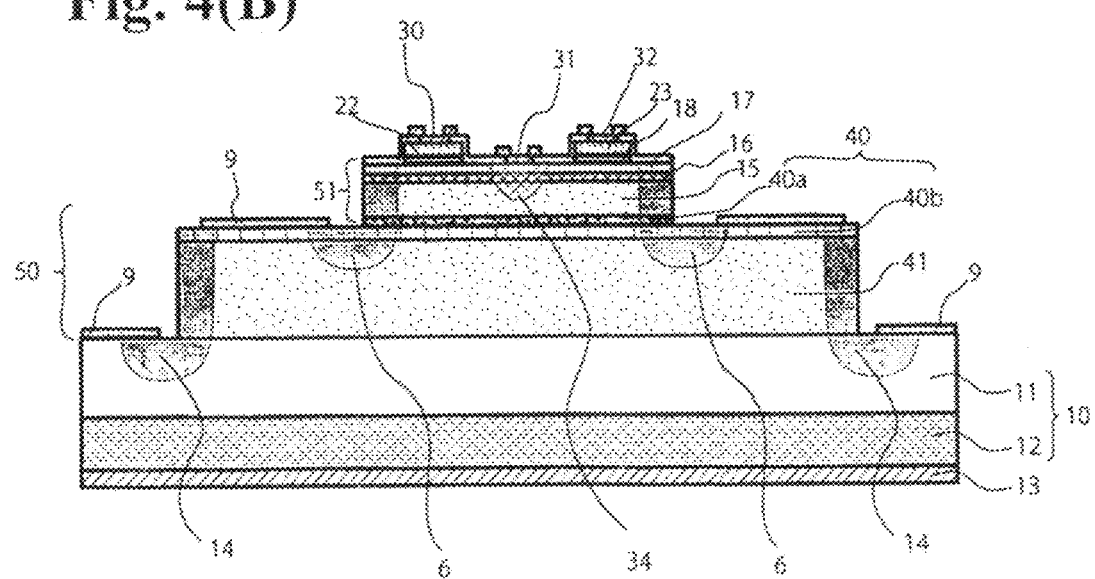
FIG. 4(B) is a cross-sectional view along the line B-B in FIG. 4(A).

Furthermore, in this embodiment, the second diffusion layer 14 is also formed with zinc doping etc. to the area, which reaches the cathode semiconductor layer 10 (in this case, to the buffer layer 11, which is the upper layer of the stacked layer structure constituting the cathode semiconductor layer 10) including the exposed sidewall of the photo-absorption layer 41. Thus, this second diffusion layer 14 created at the exposed sidewall of the photo-absorption layer 41 comprises the second mesa structure 50 and the photodiode part 50, and along the part of the exposed surface of the cathode semiconductor layer 10 (in this case, buffer layer 11), which encloses the second mesa structure 50. In such structure, a depletion layer will be formed at the boundary between the diffusion layer 14 and the photo-absorption layer 41 with the reverse conduction polarity by applying the cathode electrode 13 to the positive bias against the source electrode 30. On the other hand, the holes generated at the photo-absorption layer 41 by light illumination is injected to the channel 15 via the electron barrier layer 40, and since a charge neutrality condition should be satisfied, an amplified current can be extracted by electrons fed from the source electrode 30. As for the structure of FIG. 1, the p-n junction with a narrow bandgap semiconductor between the photo-absorption layer 41 and the electron barrier layer 40 is exposed to the sidewall of the mesa structure of the photodiode part 50. In the photo-FET of FIGS. 4(A) and 4(B), the dark current from a surface-side-depletion-layer is suppressed by the existence of the diffusion layer 14, which encloses the circumference of all the exposed sidewall of the second mesa structure 50 concentrically in a ring shape. Since the p-n junction, which comprises the photo-absorption layer 41 with a narrow bandgap semiconductor, moves toward the inside of a crystal, the p-n junction with a wide bandgap semiconductor is exposed at the surface of the electron barrier layer 40.

In addition, although the planar view of the first and second mesa structure is rectangular-shaped in the drawings, the ring shape expressed in this embodiment may be a rectangular shape or any arbitrary shape; it is not restricted to a circular shape illustrated in the embodiment form mentioned later. In other words, it means any closed shape, which encloses the mesa structure without discontinuity.

Figure 5A:
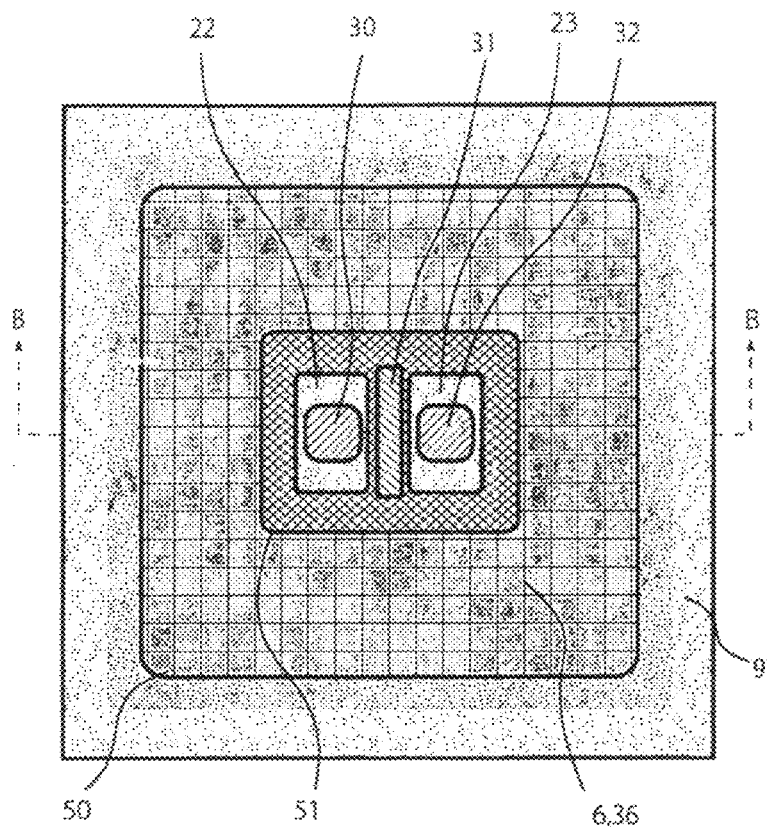
FIG. 5(A) is a plan view of another embodiment of a photo-FET of the present invention, which adopts the planer type photodiode structure partly and suppresses the surface leak current on it.
Figure 5B:
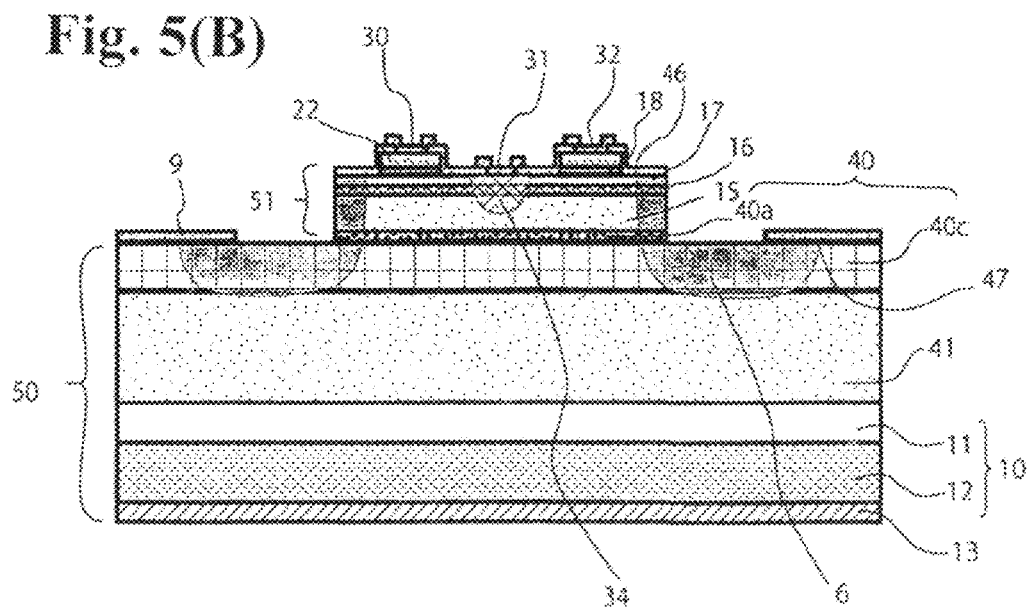
FIG. 5(B) is a cross-sectional view along the B-B line in FIG. 5(A).

FIGS. 5(A) and 5(B) show another embodiment of the present invention, featured with a small difference in level of the device surface, which can simplify the manufacturing process. It replaces the epitaxial layer of the p-type electron barrier layer 40a, which comprises an n-InP electron barrier layer 40c and a p-InAlGaAs layer, with the electron barrier layer 40b, which comprises p-InP shown in FIG. 4(B), as an electron barrier layer 40. The first mesa structure is formed by selective etching, which leaves the FET part 51 to a predefined area, and the barrier layer 40c of an n-InP layer under the mesa structure is exposed around the mesa structure. Then, the exposed sidewall of the mesa structure of FET part 51 and a part of barrier layer 40c, which encloses the mesa structure concentrically, are converted into the p-type region 6 by the selective Zn diffusion from a window of the $SiN_x$ mask 9. As for the photo-FET of this invention shown in FIG. 5, the photodiode part 50 has substantially the same structure as the planer type InP/InGaAs pin photodiode, which comprises p-type inverted InP and n-type InGaAs photo-absorption layer, and InP p-n junction 46 and 47 with a comparatively large bandgap are formed at the surface. The holes generated in the photodiode part 50 is led to a channel 15 via Zn diffused layer 6 and the p-electron barrier layer 40a. That is, the output of the photodiode part 50 is interconnected from Zn diffused layer 6 serving as the anode to the p-electron barrier layer 40a, which comprises the p-InAlGaAs layer and works as a back gate of the FET part 51, and controls the electron concentration in the channel.

Figure 6:
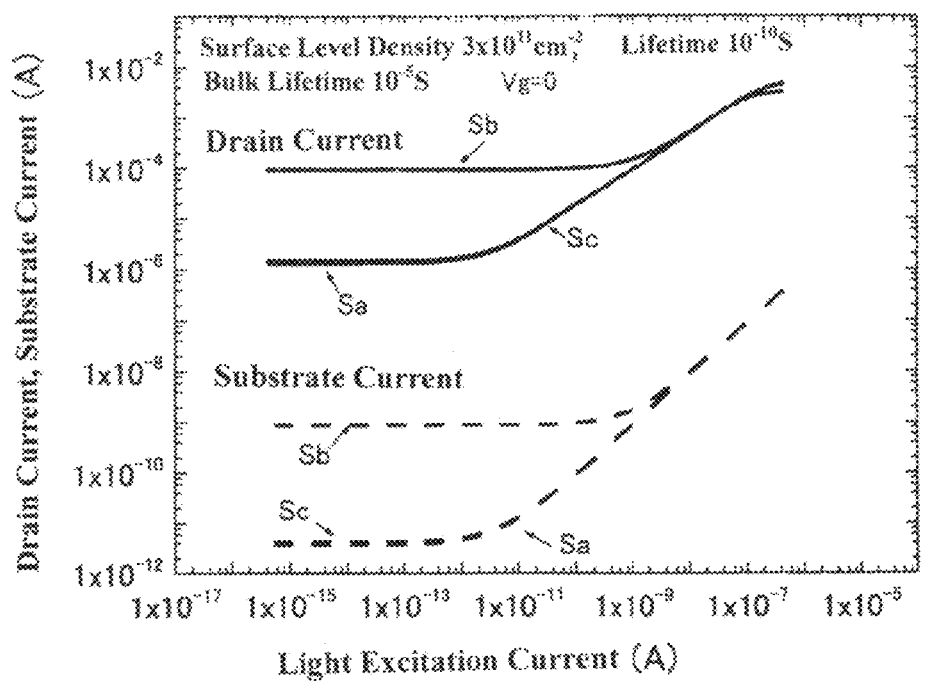
FIG. 6 shows a substrate current and a drain current of the photo-FET in FIGS. 4(A) and 4(B) against a photo-excited current generated in the device.

FIG. 6 shows the simulated characteristic of the substrate and drain current against the photoexcited current generated in the inside of the photo-FET using the InGaAs/InAlGaAs/InP photo-FET shown in FIGS. 1 and 4.

The substrate 12 of the photo-FET used for the simulation is n-InP substrate ($1\times10^{18}$ $cm^{-3}$), which is coupled with the buffer layer 11 and constitutes the cathode semiconductor layer 10 together with the substrate 12, is an n-InP ($5\times10^{15}$ $cm^{-3}$, 0.5 micrometer). The photo-absorption layer 41 formed on it is an n-InGaAs ($1.5\times10^{15}$ $cm^{-3}$, 1.5 micrometers), and the electron barrier layer 40 is made of stacked layers of a p-$In_{0.52}Al_{0.36}Ga_{0.12}As$ 40a ($5\times10^{17}$ $cm^{-3}$ or 0.1 micrometer) and p-InP layer 40b ($3\times10^{17}$ $cm^{-3}$, 0.2 micrometer). The channel layer 15 on the electron barrier layer 40 is an n-InGaAs ($1.5\times10^{14}$ $cm^{-3}$, 0.2 micrometer). The hole barrier layer 16 and Schottky barrier layer 17 are comprised of an n-dope InP layer ($3\times10^{16}$ $cm^{-3}$, 50 nm) and an n-dope InAlGaAs ($3\times10^{16}$ $cm^{-3}$, 50 nm), respectively. Surface carrier concentration of the p-type diffusion layer 6 is set to $1\times10^{10}$ $cm^{-3}$.

Also, carrier lifetime inside of the semiconductor and at the surface is assumed to be $10^{-5}$ sec and $10^{-10}$ sec, respectively. The trap density at the semiconductor surface is set $3\times10^{11}$ $cm^{-2}$. As for the dimensional conditions, the diameter of the FET part 51 is set to 11.4 micrometers and the photodiode part is set to 28 micrometers, respectively. The relative potential difference is set 2V at the cathode electrode 13 and 1V at the drain electrode 32 against the source electrode 30. The gate voltage is set −0.3V. The optimum gate voltage can be adjusted with the amount of the channel doping and intensity of the incident light.

Curve Sa in FIG. 6 corresponds to the calculated characteristics of the photo-FET in FIGS. 4(A) and (B) in which exposed sidewalls of the mesa structure comprising the channel 15 and photo-absorption layer 41, part of the surface of the adjacent hole barrier layer 16, the electron barrier layer 40b, and the cathode semiconductor layer 10 (surface of the wide bandgap buffer layer 11) are inverted into p-type by the Zn diffusion. Curve Sb corresponds to the mesa type photo-FET in FIGS. 1(A) and (B) in which Zn diffusion is not performed, but the effect of the surface trap density is included, and Sc is the case of the photo-FET without Zn diffusion in which the effect of the surface trap density is excluded. The substrate current shown with a broken line is equivalent to the photo-induced hole current generated in the photodiode part 50. In the ridge type (Sb) with the surface defect, the substrate current does not respond to the photoinduced current until about hundreds of pico-ampere (pA). On the other hand, when Zn diffusion is performed (Sa), photo-response is detectable near 1 pA corresponding to the fact that the dark current is reduced by one hundred or more by the selective Zn diffusion along the exposed sidewall of the mesa structure. Since this characteristic is mostly in agreement with curve Sc when the surface defects are not introduced in the ridge type photo-FET, it turns out that the dark current induced by a surface crystalline defect is nearly completely suppressed by the selective Zn diffusion. Moreover, the hole (substrate) current generated by the light excitation induces the drain current amplified by about 100,000 times in the channel 15 of the FET part 51. The drain current changes from tens nano-amperes to several milli-amperes corresponding to the variation of the substrate current from one pico-ampere to one micro-ampere, which is equivalent to the photodiode output, and the amplification function is demonstrated in a very wide current range.

However, the amplification function in the FET part 51 is performed against the hole current from the photodiode part 50 without any distinction between a photoexcited current and dark current. Therefore, detection limit of the photo-FET is determined by the noise component of the dark current as in the case of the conventional pin photodiode. Elimination of the surface defects is also effective to enhance the amplification performance of a photo-FET, and the selective Zn diffusion to the exposed sidewall of the mesa structure enhances the sensitivity of the photo-FET by 2 or 3 order of magnitude.

On the other hand, when a gate bias is set from −1 to −2V, a drain current is suppressed below the level of several nano-amperes. Therefore, the photo-FET of the present invention has a switching function as FET by forming a gate electrode at the surface side that may be stated in the later part. It is also possible to produce a two-dimensional photodetector array in which self-column addressing is enabled; and it is also possible by setting up an intermediate gate voltage to adjust the magnitude of the amplification in a wide range. That is, it becomes possible to have an electronic iris to adjust the sensitivity according to the luminous intensity of the object.

Although a pin photodiode has a drawback of low sensitivity, it also has an advantage of stable performance because it is based on the simple theory of operation that one photon generates one pair of electron-hole. Because the substrate current of this photo-FET of the present invention corresponds to the output of the pin photodiode, more qualitative value of the incident light intensity and the amplified signal by FET can be measured with the same device by measuring the substrate current and source current of the photo-FET simultaneously. On-site calibration of the photo-FET can be made using this function. Moreover, it can measure for a wide variety of light intensity from the very small light of fW level to a comparatively strong light of mW level continuously with the same device by measuring the substrate current for the light-intensity with which the output from FET is saturated.

In order to clarify the function of the FET part 51 of a photo-FET, the drain current, hole, and electron current component of the substrate current are calculated in case when only electrons or holes are injected from the substrate side of the FET part, respectively. As a result, the amplified drain current is obtained when holes are injected into the FET part 51 while almost no amplification effect is observed when electrons are injected. That is, in the photo-FET of this invention, the current injection-type bipolar photo-FET or conductivity modulation device is realized, which selectively accumulates the holes as minority carriers, and gains an amplification function by passing the equivalent amount of electrons at high speed.

Figure 7A:
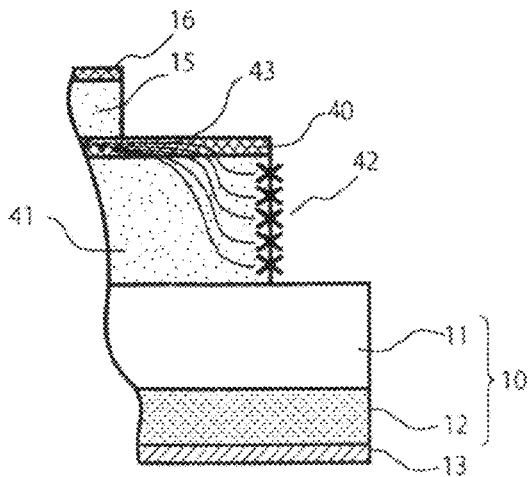
FIG. 7 explains the mechanism to suppress the surface leak current of the photo-FET shown in FIGS. 4(A) and 4(B).
Figure 7B:
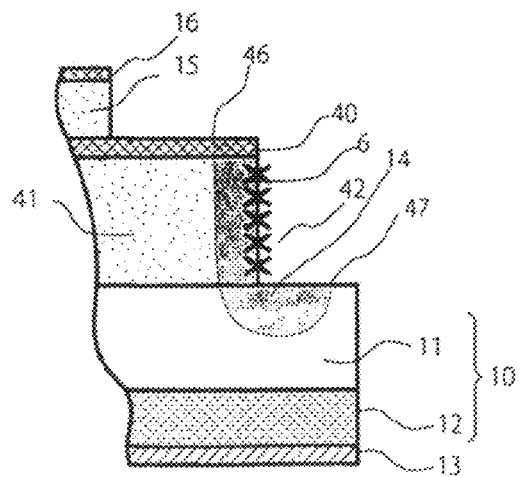

FIGS. 7(A) and 7(B) illustrate the dark current suppression effect by the specific embodiment of the present invention either with or without the diffusion layer 14 (FIG. 4). This diffusion layer 14 is not disposed in the structure shown in FIG. 7(A). In this case, the exposed sidewall of the photo-absorption layer 41 in the photo-FET is depleted near the p-n junction formed between the electron barrier layers 40 by a reverse bias of the cathode electrode 13. Since the surface defects 42 generated at the exposed sidewall of the photo-absorption layer 41 are crystal defects in a narrow bandgap semiconductor, they work as an active minority carrier generation source at a depletion condition and cause a large dark current.

In the case of the structure shown in FIG. 7(B) where the diffusion layer 14 converted into the high-concentration single type semiconductor layer is formed at the sidewall of the exposed p-n junction according to the specific embodiment of the present invention, p-n junction is formed inside of the device and at the surface 46 of the electron barrier layer 40, which has a wide bandgap, and the surface 47 of the cathode semiconductor layer 10 (wide bandgap buffer layer 11). As for the exposed sidewall of the mesa structure covered by the high-concentration p-type semiconductor layer, it becomes close to a thermal equilibrium state, and a depletion layer or a minority carrier accumulation layer does not exist. Therefore, the minority carrier generation is suppressed at the exposed sidewall of the mesa structure even if surface crystalline defects remain at high-concentration. The p-n junction exposed to the surface 46 of the intrinsic emitter and the surface 47 of the wide bandgap buffer layer 11 is formed with the semiconductor layer, which has a large bandgap. Therefore, while intrinsic carrier concentration $n_i$ becomes small, the energy difference from the trap, which exists near the middle of bandgap energy to the band edge, becomes larger, and the dark current at the surface is suppressed according to the well-known SRH statistics.

The photo-FET of this invention shown in FIGS. 1, 4, and 5, is superior in the structure as well. Since the area of the channel layers 15 of the FET part 51 is smaller than that of the electron barrier layer 40 of the photodiode part 50, the photoinduced holes are concentrated in the FET channel of a small area. Sensitivity and the amplification factor are improved due to the enhanced variation of the electron concentration of the channel in the FET part 51.

Generally as for a FET, the FET with a short channel length has a large transconductance. Moreover, as for the current injection-type bipolar photo-FET of the present invention, the variation of the conductivity becomes large, and the ratio of the photoexcited current and the dark current can be improved when the channel volume is small and the hole current generated in the photodiode part concentrates in the small area. In the photo-FET of the present invention, the drift field against the holes is formed from the surrounding area toward the source electrode 30, and efficient transport of the photoinduced charge in the FET part becomes possible by applying high set voltages in the sequence of the source electrode 30, the drain electrode 32, and the cathode terminal 33. Furthermore, the gate electrode 31 and the drain electrode 32 are arranged in a concentric pattern to the source electrode 30. The drain electrode 32 is set positive in the FET part 51, and the holes are drifted into the center with this electrode structure. Therefore, enhancement of the sensitivity and amplification factor is ensured. Also, the dark current due to the local electric field concentration is prevented by eliminating the electric field from concentrating on the specific part between each electrode.

The gain of the FET part 51 becomes 10,000 to 100,000 times, which is equivalent to the hole lifetime in the FET channel divided by the electronic transit time. As mentioned before, in the photo-FET of this invention, the holes are intentionally confined inside the channel with the hetero barrier, the impurity diffusion from the sidewall, and the bias electric field by the electrodes in order to increase the gain of the FET part 51. As a result, the response time of the photo-FET is restricted to approximately 100 kHz accompanying to the high gain in the FET part 51 at the simulation and the fabricated device. Thus, this photo-FET of the present invention is principally for the low speed applications, and it is not suitable for high-speed optical communication of approximately more than 100 MHz frequency response range. However, the response time is sufficient for the extensive field of applications such as usual physics and chemistry measurement or imaging devices.

Figure 8A:
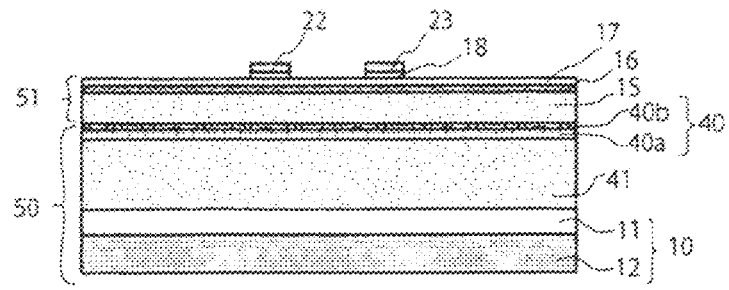
FIG. 8(A) explains the first process for the fabrication sequence of the photo-FET device shown in FIGS. 5(A) and 5(B).

FIGS. 8(A) to (D) show the example of the manufacturing process for fabricating the invented photo-FET indicated in FIGS. 5(A) and (B). As shown in FIG. 8(A), a part of the n-InGaAs contact layers 22 and 23 at the surfaces of the FET part 51 and the photodiode part 50 formed by the epitaxial growth on a substrate 12 and buffer layer 11, are selectively removed by the wet etching with the solution of phosphoric acid (85% water solution):hydrogen peroxide solution (30% water solution):water=1:1:38. Furthermore; when the InAlGaAs Schottky barrier layer 17 and the InP etch stop layer 18 are desirably formed, the source and drain contact layers are formed by a selective etching of the InP etch stop layer 18 with an etching solution of hydrochloric-acid (35% water solution):tartaric-acid (0.5 mol water solution):water=2:3:2. As a result, either the InAlGaAs Schottky barrier layer 17 or the InP hole barrier layer 16 is selectively exposed except for the areas other than the source and drain contact layers.

Figure 8B:
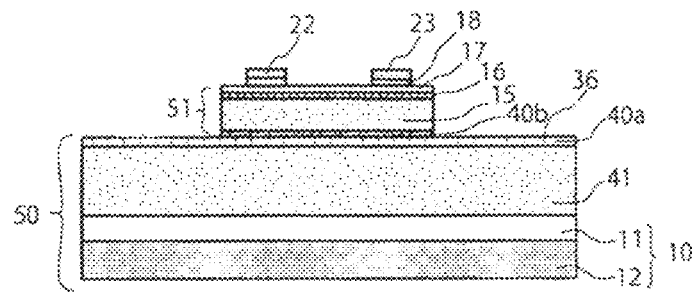
FIG. 8(B) explains the subsequent process to FIG. 8(A).

As shown in FIG. 8(B), after removing the InP holes barrier layer 16 except for the cylindrical region serving as the FET part 51, with hydrobromic-acid (47% water solution):saturation bromine water-solution:water=5:1:40 solution, the lower n-InP electronic barrier layer 40*a* is exposed to the air by selectively etching the remaining part of the InGaAs channel and the p-InAlGaAs electronic barrier layer 40*b* of the upper layer of the electronic barrier layer 40 with an etching solution of phosphoric acid:a hydrogen peroxide:and water=1:1:38. The exposed electronic barrier layer 40 (40*b*) serves as the photosensitive area 36, which functions as a window to sense light. In order to fabricate the photo-FET shown in FIGS. 1(A) and (B), the following processes can be applied as in the proceeding section. That is, the n-InP buffer layer 10*b* is exposed by the selective etching of the p-InP electron barrier layer 40*b*, which is the photosensitive area 36 at the surface, and InGaAs photo-absorption layer 41 with the combination of the etchants, which either does or does not etch the InP. Also, the separation groove 38 for isolation between adjacent elements is formed around the device.

Figure 8C:
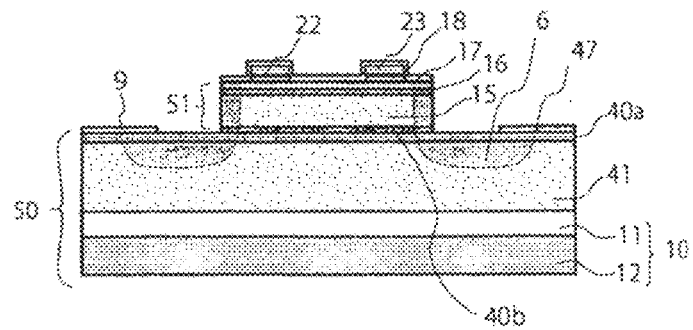
FIG. 8(C) explains the subsequent process to FIG. 8(B).
Figure 8D:
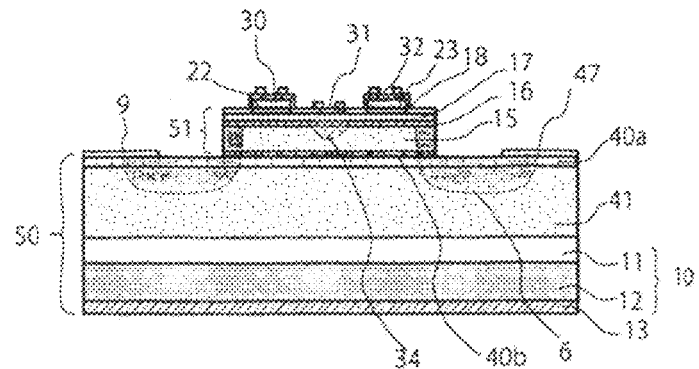
FIG. 8(D) explains the subsequent process to FIG. 8(C).

Then, as shown in FIG. 8(C), after forming 200 nm thick $SiN_x$ film 9 over the whole surface by plasma CVD etc., the Zn diffusion window is formed by dry etching etc., and the Zn diffusion area 6 is formed in the closed ample. Then, after covering the Zn diffused area with a $SiN_x$ film again, the gate electrode 31, the source electrode 30, and the drain electrode 32 are formed in order, and the cathode electrode 13 is formed in the rear surface of the InP substrate 12, as shown in FIG. 8(D), thus, the invented photo-FET shown in FIG. 5 is finally completed.

In these production processes, the InP etch stop layer 18 or the InP hole barrier layer 16 and the p-InP electron barrier layer 40b functions as an etching stopper for the selective etching of the Schottky barrier layer 17 and the channel layer 15, respectively. That is, taking advantage of the fact that an etching solution of the phosphoric acid:hydrogen peroxide:water=1:1:38 does not etch an InP layer, the p-InP electron barrier layer 40b and InP buffer layer 11 are used for an etching stopper in addition to the InP etch stop layer 18 or the n-dope InP hole barrier layer 16. The selective etching processes are necessary only 3 times to separate into the configuration of each geometry of a source, the drain contact layers 22 and 23, the FET part 51, and the photodiode part 50 from the epitaxial structure, which has a stacked layer structure of the photodiode part 50 and the FET part 51 formed with one time MOCVD crystal growth. This simplified method greatly contributes to the improvement of the production yield.

Figure 9:
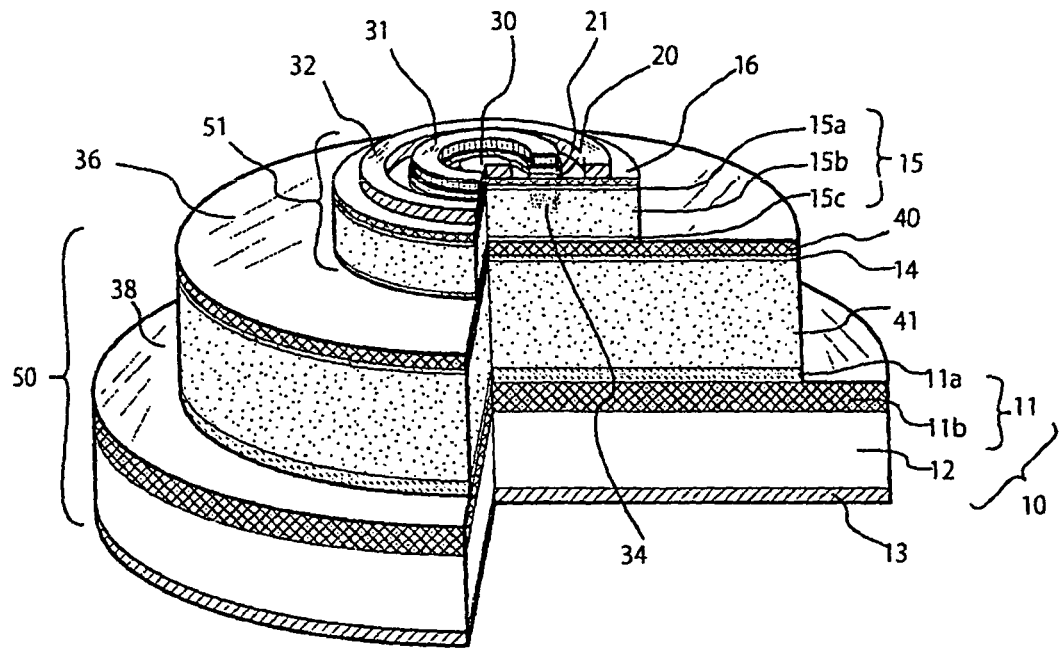
FIG. 9 is a perspective view including a partial cross-section of the photo-FET, wherein the gate of the photo-FET shown in FIGS. 1(A) and 1(B) is replaced with a Schottky junction-type as one of the embodiment forms of the present invention.

FIG. 9 illustrates the partial cross-section perspective view of another embodiment of the present invention. In this structure, the p-InAlGaAs/InGaAs gate contact layer 21 is epitaxially grown beforehand under the gate electrode 31 in FIGS. 1(A) and (B), and the p-n junction gate is formed in place of the Schottky junction. Moreover, on the surface geometry, the gate electrode 31 and the drain electrode 32 surround the source electrode 30 in a concentric manner and radically apart from each other in a certain distance. In the cross-sectional structure, the cathode semiconductor layer 10 is formed with three epitaxial layer structure of the buffer layer 11b, which comprises n-InP ($1\times10^{17}$ $cm^{-3}$, 0.1-1 micrometer) on n-type InP substrate 12 ($5\times10^{18}$ $cm^{-3}$), and n-InGaAsP step graded layers 11a (for example, 50 nm each of the $In_{0.86}Ga_{0.14}As_{0.31}P_{0.69}$ and $In_{0.72}Ga_{0.28}As_{0.61}P_{0.39}$ which are lattice matched to InP with the luminous wavelength of 1100 nm and 1300 nm, respectively). Then, the photo-absorption layer 41, which comprises a non-doped n-InGaAs (background dope: about $5\times10^{14}$ $cm^{-3}$ of n-type), is formed on this cathode semiconductor layer 10. And the electron barrier layer 40 (it serves as the anode layer of the photodiode part 50), which comprises p-InP ($3\times10^{17}$ $cm^{-3}$ or 0.2 micrometer), is formed through the InGaAsP step graded layer 14. Moreover, the channel layer 15 formed on the before-mentioned layers is comprised of the three stacked layer structure of the second step graded layer 15a that comprises InGaAsP, n-InGaAs channel layer 15b (background dope: about $5\times10^{14}$ $cm^{-3}$ of n-type), which serves as the main channel regions, and the InGaAsP step graded layer 15c.

The gate contact layer 21, which comprises the epitaxial layers of a p-InAlGaAs layer and a p-InGaAs layer ($3\times10^{17}$ $cm^{-3}/3\times10^{18}$ $cm^{-3}$), is stacked through the n-dope InP hole barrier layer 16 ($3\times10^{17}$ $cm^{-3}$ or 40 nm) and the InGaAsP step graded layer 20 on the channel layer 15. Also as for the p-n junction formed by the epitaxial growth, it is desirable that the depletion layer be formed in InP or InAlGaAs in which the bandgap is relatively wide. In addition, the thickness of the photo-absorption layer 41 is usually set to 1 to 3 micrometers depending on the optical absorption coefficient of the target light wavelength. Moreover, since the fixed electric charge generated in the depletion layer of the electron barrier layer 40 and the photo-absorption layer 41 should satisfy the electrical neutrality conditions when the reverse bias is applied, the product (surface doping density) of the p-type doping concentration and thickness of the electron barrier layer 40 needs to be set larger than the photo-absorption layer 41.

The function of the electron barrier layer 40 is also preserved when the p-InP electron barrier layer 40 is formed on the p-n junction type photodiode where the surface side of the photo-absorption layer 41 is converted to the p-type. Thus, the electron barrier layer 40 prevents the inflow of the electrons from the channel layer 15 of the FET part 51 to the photodiode part 50, and on the other side, it injects holes from the photodiode part 50 to the channel layer 15.

Furthermore, in this embodiment, the concentration of electrons induced by the channel layer 15 of the FET part 51 is adjusted with the modulated doping concentration of the hole barrier layer 16. As a photo-FET, it is desirable that the channel be closed and the dark current be suppressed under dark condition by the depletion layer extended from the p-type gate contact layer 21 downward and the p-type electron barrier layer 40 upward, and on the other side, the electron current be induced by the upper and lower depletion layers shrinking gradually with light illumination. In the photo-FET of this invention, it is possible to adapt a modulation-doped structure to the hole barrier layer 16 instead of doping the channel layer 15 of the FET part 51. Thus, it is possible to induce electrons without reducing the electron mobility of the channel and reduce each contact resistance of the source and drain electrodes.

Figure 10:
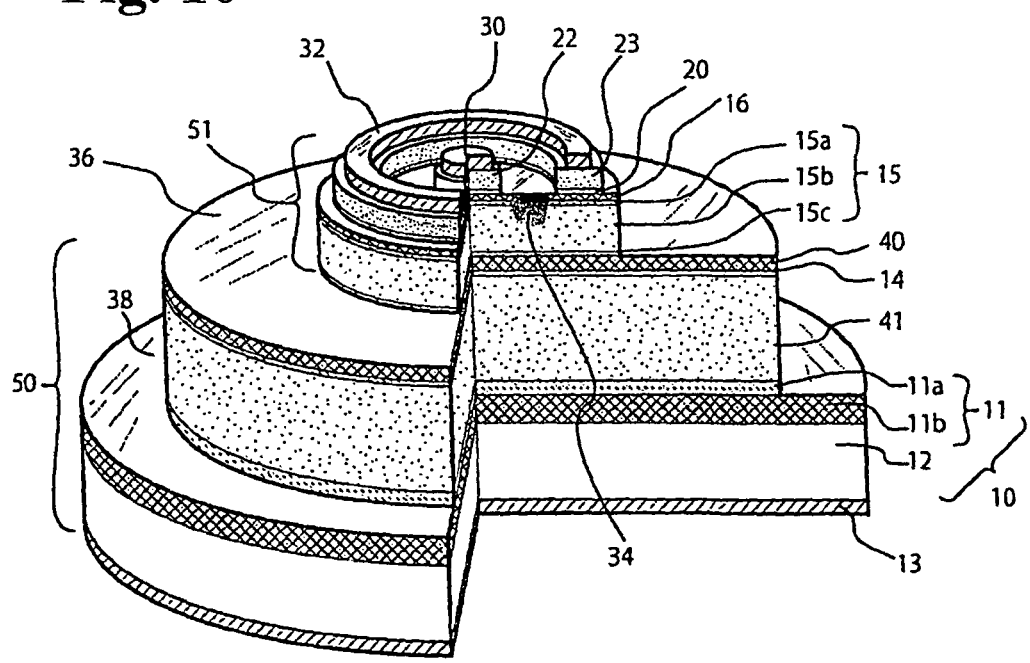
FIG. 10 is a perspective view including a partial cross section of the photo-FET without the gate electrode as another embodiment form of the present invention.

When the photo-FET of this invention is provided as a single device or as a one-dimensional element array, it is also possible to simplify the fabrication process and drive circuit of the device by removing the Schottky gate layer 19, gate contact layer 21, and gate electrode 31. FIG. 10 also illustrates the other embodiment of the present invention where the gate electrode is removed as an alternative type of the photo-FET shown in FIG. 9. Other structural parts may be the same as that of the photo-FET shown in FIG. 4 or 9. Although the manufacturing process is obviously simplified by not providing the gate electrode, there is a tendency for the surface potential to become low rather than the case where a p-n junction or Schottky junction is formed. The source current can be controlled more effectively if the InP hole barrier layer 16 is set to non-doped to serve as the surface side depletion layer generation layer, and the surface side depletion layer 34 in a dark state is extended throughout the channel-layer 15 of the FET part 51.

When devices are arranged side by side, it is necessary to keep each device further apart than the depletion layer depth and hole diffusion length at the diffusion layer 14 (FIG. 4) or the outer circumference of the device 6 (FIG. 5), which is induced by the bias voltage. For example, if the carrier concentration is about $10^{15}$ $cm^{-3}$, about 8-10 micrometers of distance is required.

Figure 14:
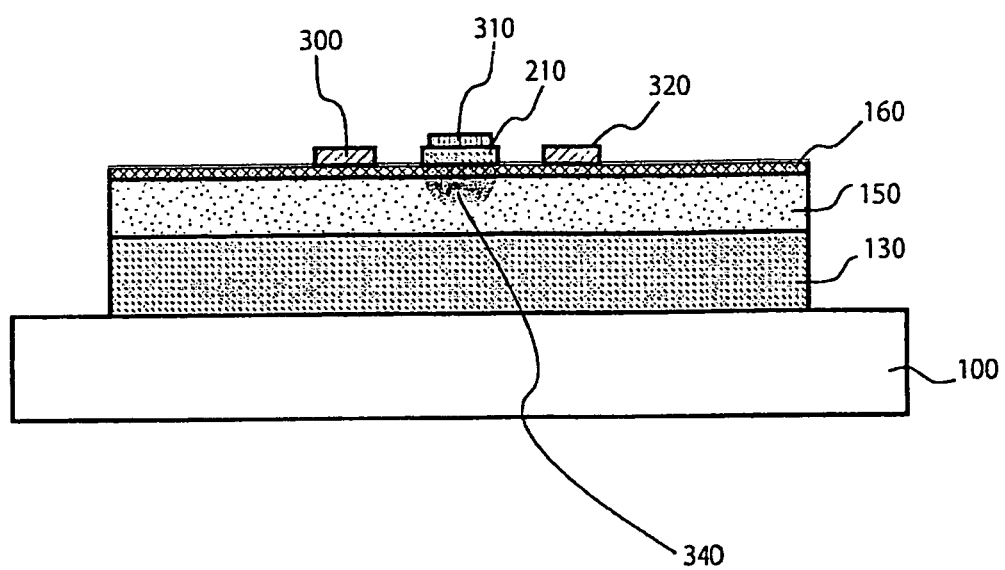
FIG. 14 is the schematic view of the conventional photo-FET, which is the inventor's previous invention.

When the inventors compared the performance of the present invention with the prior photo-FET explained previously in FIG. 14, which is disclosed in Document 3, a large improvement (about 10 to 100 times, depending on the device size) is accepted in the ratio of the photoexcited current to the dark current. Since application of the reverse bias voltage to a photodiode part became possible while keeping the source drain bias voltage of FET low, impact ionization induced by the carrier transport in the FET part has been prevented. Dark current component in a photodiode part is suppressed at the mesa sidewall of a photodiode by converting into p-type by Zn diffusion while applying the hole drift filed to the photodiode part serving as a photosensitive layer. Moreover, it is verified that the frequency response characteristic has also been improved. This possibly occurred due to the decrease of the floating charge component with a long time constant by interconnecting the current output of the photodiode to the channel part of the FET directly.

Figure 11:
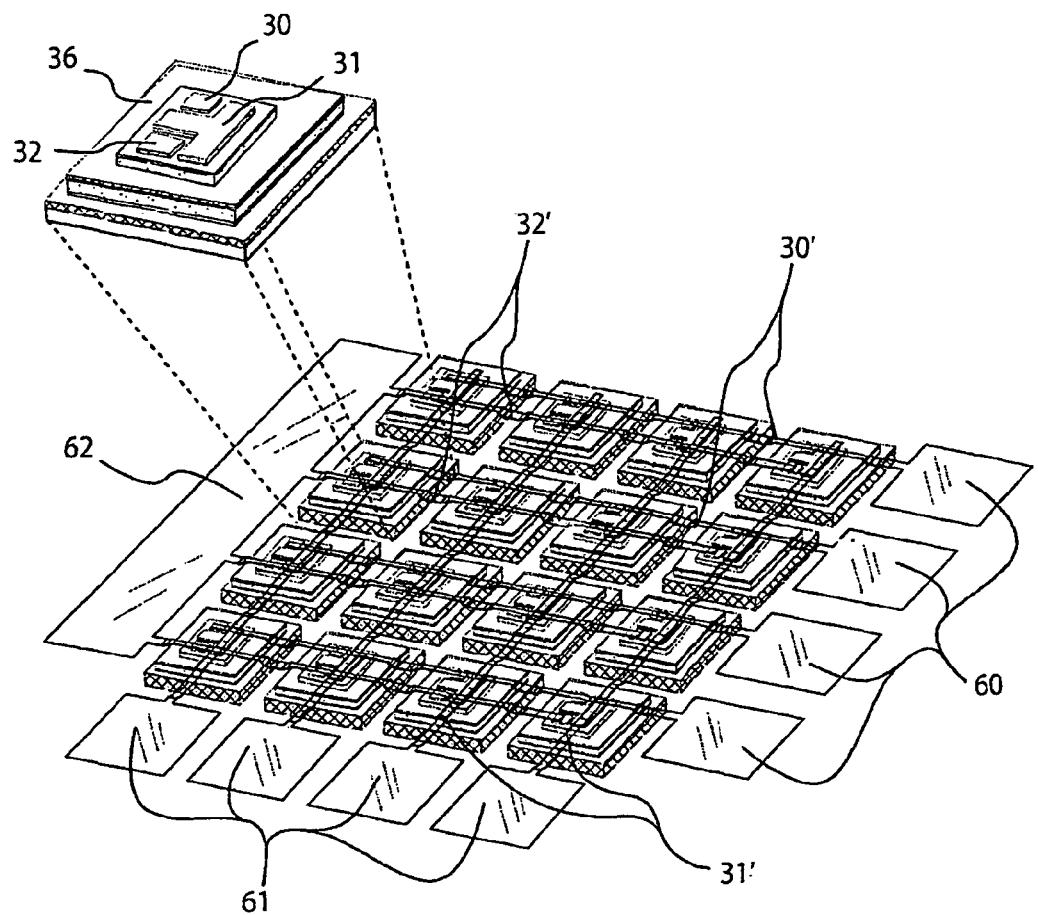
FIG. 11 is a schematic view of the two-dimensional matrix structure, which integrates these invented photo-FETs.

FIG. 11 shows an example of the two-dimensional matrix structure, which accumulates the devices of this invention. Multiple photo-FETs of this invention shown in FIGS. 1(A) and (B) are arranged in a matrix, and each source electrodes 30, which belongs to the same row, are interconnected with each other by the source wiring 30' and lead to the bonding pad 60 for the source electrodes formed on the suitable substrate. On the other hand, each gate electrode 31, which belongs to the same column, is also interconnected to each other by the gate wiring 31' and lead to the bonding pad 61 for the gate electrode. In addition, the drain electrode 32 is connected to the bonding pad 62 for the drain electrodes by the drain wiring 32' common to each device.

Since the photo-FET of this invention comprises the photodetector and the FET stacked together as mentioned before, it collects the photoinduced holes generated under the gate and varies the electron current passing through the FET channel. In addition to amplifying and reading the optically induced electric charge, it has the function of a matrix switching to cut off the photocurrent output by negatively biasing the gate voltage even under light illumination.

And, as for each of these embodiments in the photo-FET of this invention shown in FIGS. 9 and 10, the source electrode 30 is surrounded with the drain electrode 32 and further surrounded with the gate electrode 31 in the case of the embodiment shown in FIG. 10. Also as for the FET part, it is designed for holes to drift toward the center of the device, but if there is a restriction on the device area, each electrode of the source, gate, and drain can be arranged in parallel on the area according to the device structures of the embodiments shown in FIGS. 1, 4, and 5. And it is also possible to ensure the stable gate characteristics with a p-n junction by inverting the hole barrier layer 16 to p-type with Zn diffusion etc. only when under the gate electrode 31 while keeping the good source and drain ohmic contact characteristics of the source, drain contact layers 22, 23.

The photo-FET by the present invention is applicable to the various compound semiconductor material system in which hetero epitaxial growth is possible. For example, in addition to the InGaAs/InP system shown in the embodiment (about 1.6 micrometers and up to 2.5 micrometer in the lattice mismatched system), AlGaAs/GaAs, and InGaP/GaAs system as for a 0.8 micrometer wavelength range, and InAs/InAsP and InAs/AlGaAsSb (about 3.5 micrometers, InAs substrate), InAsSb/InAlGaSb/AlGaAsSb and InAsSb/InAsP (about 5-micrometer, GaSb substrate) system especially effective for a mid-infrared photodetector, the InGaP/AlGaP system for a visible region, and the AlGaN/GaN system for blue and purple region are applicable. In addition, the photo-FET has an advantage of maintaining the photo-sensitivity of the short wavelength because of the shallow photosensitive layer even when it employs long wavelength photo-absorption materials. Therefore, there is an advantage that a single photodetector can cover wide wavelength range in which two or more photodetectors with different materials have been necessary.

The following table 1 shows the material system and the corresponding wavelengths of the photo-FET. The hole barrier layer needs to have a material in which the band offset is large to the valence band, and the electron barrier layer needs to have a material in which the band offset is larger than the conduction band. However, the above-mentioned band-offset conditions become less indispensable in the case when the hole barrier layer is doped to n-type and the electron barrier layer to p-type, respectively, because built-in potential is generated by doping. Moreover, electrons and the hole barrier layers are not necessary to fulfill the lattice matching conditions to the substrate or the photo-absorption layer since they are functional at less than several tens nanometer thick. Binary compound semiconductor materials without alloy scattering are more desirable for the channels because materials with high mobility can provide high sensitivity. It is also feasible to ensure the high sensitivity proportional to the increase in the mobility at low temperature by cooling the device.

TABLE 1

Materials used for photo-FET

| Materials | Hole Barrier Layer (16) | Channel Layer (15) | Electron Barrier Layer (40) | Photo Absorption Layer (41) | Wave Length μm |
|---|---|---|---|---|---|
| In GaAs/In P | In P | InGaAs | In P | InGaAs | ~1.6 |
| InGaAs/InAlGaAs | In P or InAlGaAs | InGaAs | InAlGaAs | InGaAs | ~1.6 |
| InAs/InAsP | InAsP | InAs | InAsP | InAs | ~3.5 |
| InAsSb/InAsP | InAsP | InAs | InAsP | InAsSb | ~5 |
| AlGaAs/GaAs | AlGaAs | GaAs | AlGaAs | GaAs | ~0.8 |
| InGaP/GaAs | InGaP | GaAs | AlGaAs or InGaP | GaAs | ~0.8 |
| InGaP/InGaAlP | InGaP | GaAs | InGaAlP | InGaP | ~0.65 |
| AlGaN/GaN | AlGaN | GaN | AlGaN | GaN | ~0.36 |

Because the optical absorption wavelengths of toxic gases and the environmental gases such as methane, NOx, CO, $CO_2$, etc. exist in the mid-infrared wavelength band of 2 to 5 micrometers, the photo-detectors with high sensitivity and high operational temperatures as high as possible are in high demand in this wavelength range. Although InSb has been generally used as a compound semiconductor material corresponding to the mid-infrared wavelength region, it needs to cool down to about 100-150K with liquid nitrogen or a mechanical refrigerator since its narrow bandgap energy causes large dark current. When using $InAs_{(1-x)}Sb_x$ for the photodiode part, the bandgap can be tailored corresponding to the operation temperature. Thus, it is possible to suppress the generation of the excessive dark current at 200K, which can be achievable by Peltier-cooling by adjusting the optimum Sb composition up to 5 micrometers for the atmospheric window. In order to have a photo-sensitivity in a mid-infrared wavelength region, the semiconductor, which has a narrow bandgap, should be inevitably used. As a result, the minority carrier density in the thermal equilibrium condition becomes large, and the reverse saturation current increases. Therefore, "nBn photodiode" is proposed as mentioned in the following Document 8 to suppress the dark current. In this nBn photodiode, the valence band is designed to be continuous, and photoinduced current are led without barriers to the anode region. As for the conduction band, the barrier of the n-AlGaSb layer is provided and the electron current from the photo-absorption layer is blocked. Furthermore, the hole concentration as a minority carrier is decreased by doping the InAsSb photo-absorption layer to an n-type, and the dark current component is suppressed.

Document 8: H. Shao and W. Li, A. Torfi and D. Moscicka, and W. I. Wang, 'Room-Temperature InAsSb Photovoltaic Detectors for Mid-Infrared Applications', and IEEE PHOTONICS TECHNOLOGY LETTERS, VOL. 18, No. 16, Aug. 15 (2006), p. 1756-1758

Moreover, as for the Sb based hetero-bipolar transistor (HBT), it is shown in the following Document 9 that it is possible to ensure valence band offset of 0.36 eV between the emitter and the base by setting $In_{0.52}Al_{0.48}As_{0.25}Sb_{0.75}$ layer as the emitter and $In_{0.27}Ga_{0.73}$ Sb layer as the base, respectively.

Document 9: R. Magno, E. R. Glaser, B. P. Tinkham, J. G. Champlain, J. B. Boos, M. G. Ancona and P. M. Campbell, 'Narrow bandgap InGaSb and InAlAsSb alloys for electronic devices', J. Vac. Sci. Technol. B 24(3), May/June 2006 p. 1622-p 1625

Figure 12:
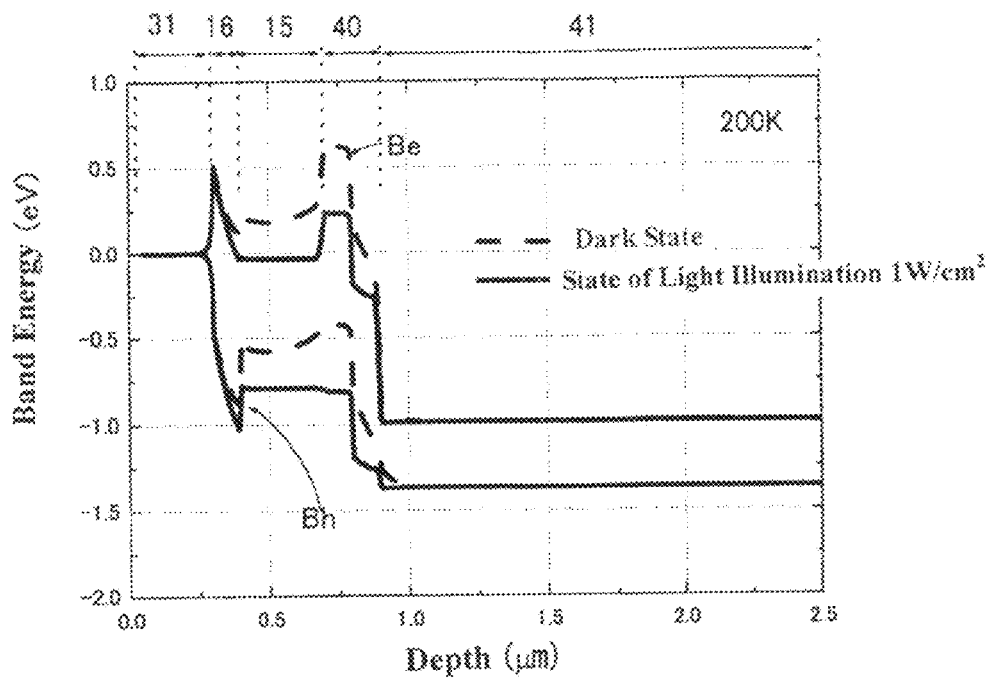
FIG. 12 illustrates the band profile with and without light illumination in the invented photo-FET, which has a sensitivity in the mid-infrared wavelength region.
Figure 13:
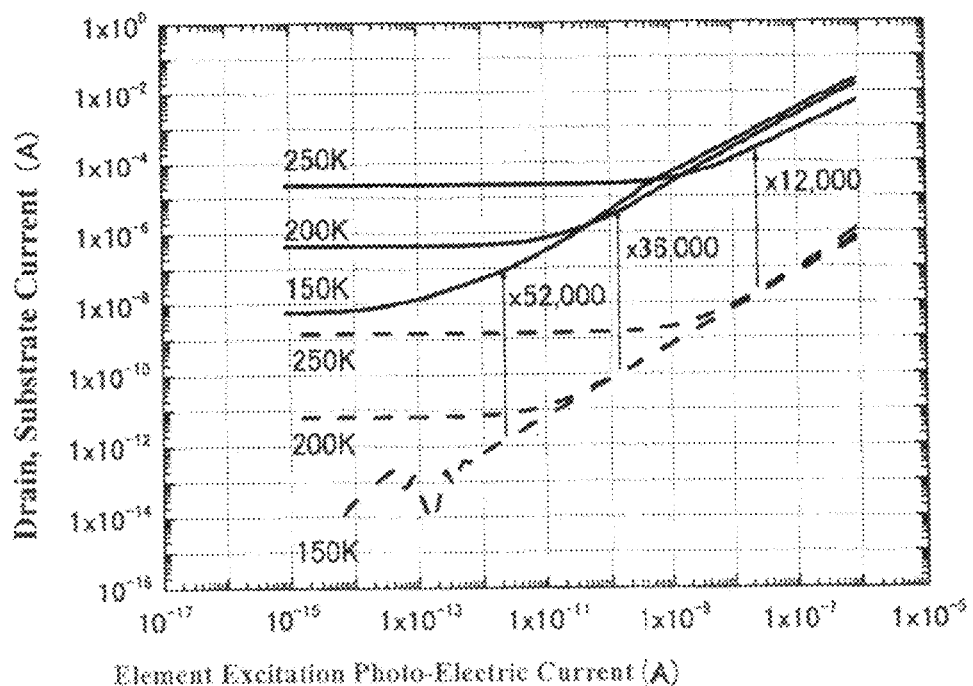
FIG. 13 explains the temperature dependence of this invented photo-FET, which has a sensitivity in the mid-infrared wavelength region.

FIG. 12 shows the band profile of the photo-FET of this invention with and without light illumination when the Photodiode part 50 is the nBn structure comprising of the n-InAs layer and the n-$In_{0.52}Al_{0.48}As_{0.25}Sb_{0.75}$ layer, the electron barrier layer 40 is the $Al_{0.14}GaSb$ layer, and the channel layer 15 is the GaSb layer. FIG. 13 also indicates the simulation result of the temperature dependence of the device characteristics.

As for the simulation of the photo-FET of this invention, the substrate 12 is defined as an n-InAs substrate ($1\times10^{18}$ cm$^{-3}$), the buffer layer 11 as an n-InAs layer ($5\times10^{16}$ cm$^{-3}$ or 0.5 micrometer), the photo-absorption layer 41 as an n-InAs layer ($2\times10^{16}$ cm$^{-3}$ or 2.3 micrometers), the electron barrier layer 40 as the stacked layer structure comprising an n-$In_{0.52}Al_{0.48}As_{0.25}Sb_{0.75}$ layer ($2\times10^{16}$ cm$^{-3}$, 0.1 μm) and a p-$Al_{0.14}GaSb$ layer ($2\times10^{17}$ cm$^{-3}$, 0.1 μm); the channel layer 15 as an n-GaSb layer ($5\times10^{15}$ cm$^{-3}$ or 0.3 micrometer), and the hole barrier layer 16 as an n-$In_{0.52}Al_{0.48}As_{0.25}Sb_{0.75}$ layer ($6\times10^{16}$ cm$^{-3}$, 0.1 μm) and also serving as the Schottky barrier layer 19. The carrier lifetime inside the semiconductor is assumed to be $10^{-5}$ sec. As for the dimensional conditions, the diameter of the FET part 51 is set to 11.4 micrometers and the diameter of the photodiode part 50 is set to 28 micrometers, respectively. As for the potential difference relative to the source electrode 30, the cathode electrode 13 is set at 2V, the drain electrode 32 is set at 0.5V and for the gate voltage is set at 0V, respectively.

As for FIG. 12, no barrier exists in the valence band from the InAs photo-absorption layer 41 through towards the GaSb channel layer 15. While photoinduced holes are injected to the channel layer 15 and remaining in the channel layer 15 by the hole barrier layer 16, the electron flow from the channel layer 15 to the InAs photo-absorption layer 41 is blocked by the electron barrier layer 40 comprising the p-$Al_{0.14}GaSb$ layer and n-$In_{0.52}Al_{0.48}As_{0.25}Sb_{0.75}$ layer. That is, the low dark current photodiode by the nBn structure and the current injection-type bipolar FET are integrated into the same epitaxial growth layer in which an amplification function is ensured by selectively accumulating holes as minority carriers and driving the equivalent amount of electrons at high speed.

As shown in FIG. 13, the horizontal axis indicates the current equivalent of the electrons and hole pair induced by the photo-absorption layer under light illumination, and the vertical axis indicates the drain and substrate current, respectively. The drain current rises up from the current equivalent of the induced electrons and hole pair around 1 nA, 5 pA and 10 fA, at the device temperature of 250K, 200K, and 150K, respectively. That is, the DC detection limit, which is the light power equivalent to the dark current, is about one pico-watt in 200K realized by Peltier cooling, and some femto-watt level in 150K, which can be realized by a mechanical refrigerator. Moreover, the drain current is amplified by 10,000 to 50,000 times of the substrate current corresponding to the photo-excitation current. In general, it is difficult to read the photo-induced current below pico-ampere level precisely, however, in the case of this photo-FET, it becomes possible to remove the noise effect by the external electrical amplifier especially under low illumination because some pico-ampere is amplified to several nano-amperes by the internal amplification function.

As for this simulation, although the effect of the recombination and generation current by a surface defect level is not taken into consideration, the effect of surface can be suppressed by sandwiching both sides of the photosensitive layer with the wide bandgap semiconductors, such as InAlAsSb and AlGaSb, and carrying out the Zn diffusion from an exposed sidewall towards the inside of a layer. When the photo-absorption layer is set to $InAs_{0.8}Sb_{0.2}$, it is effective to replace the GaSb layer and AlGaSb layer with a GaSbAs layer and an AlGaAsSb layer, respectively, in order to keep lattice matching conditions strictly.

In general, in the case of the long wavelength photodetector with a narrow bandgap, there is a tendency that a reverse saturation current of the p-n photodiode increases, which needs to cool down the device. Since this photo-FET is combined with the low dark current nBn photodiode, with equivalent sensitivity, operation temperature is able to set about 100 degrees higher compared to the conventional InSb diode based FPA system. Therefore, the conventional mechanical refrigerator can be replaced with the Peltier-cooling device without deteriorating the detection sensitivity.

What is claimed is:

1. A photo-FET wherein an FET part is stacked on a photodiode part, said photo-FET comprising at least: a semiconductor layer forming a photo-absorption layer of said photodiode part, which is formed on a cathode semiconductor layer of said photodiode part; an electron barrier layer, which is formed on said photo-absorption layer and forms a semiconductor layer with a bandgap wider than that of said photo-absorption layer, and works as an anode layer of said photodiode; a channel layer, which is formed on said electron barrier layer and forms a semiconductor layer with a bandgap narrower than that of said electron barrier layer, said channel layer forming a channel region of said FET part; a hole barrier layer, which is formed on said channel layer and comprises a semiconductor with a bandgap wider than that of said channel layer; and a source electrode and a drain electrode, formed on said hole barrier layer, which are separated from each other; wherein holes injected into said channel layer, by light illumination, through said electron barrier layer from said photo-absorption layer are confined in the channel layer by said hole barrier layer, and electrons in the channel layer are also confined in this channel layer by said electron barrier layer.

2. A photo-FET according to claim 1, wherein said channel layer is formed in a mesa structure with an exposed sidewall; and
   an impurity diffusion layer in which conductive impurities with polarity opposite to that of the channel layer are doped is formed at the exposed sidewall of said channel layer and an exposed surface at a portion surrounding the mesa structure in the electron barrier layer underneath the mesa structure.

3. A photo-FET according to claim 1, wherein said cathode semiconductor layer includes a bandgap wider than that of the photo-absorption layer;
   said electron barrier layer and said photo-absorption layer are formed in a second mesa structure with exposed sidewalls; and
   an impurity diffusion layer in which conductive impurities with polarity opposite to that of the photo-absorption layer are doped is formed at the exposed sidewalls of said electron barrier layer and said photo-absorption layer, and an exposed surface at a portion surrounding the second mesa structure in the cathode semiconductor layer underneath said second mesa structure.

4. A photo-FET according to claim 1, wherein said cathode semiconductor layer is an n-type semiconductor layer, said photo-absorption layer is either an n-type or non-doped semiconductor, said electron barrier layer is a p-type semiconductor, said channel layer is either an n-type or a non-doped semiconductor, and the hole barrier layer is either an n-type or non-doped semiconductor.

5. A photo-FET according to claim 1, wherein said cathode semiconductor layer is an n-type semiconductor layer, said photo-absorption layer is either an n-type or non-doped semiconductor with p-type impurity doped at a surface, said electron barrier layer in contact with said surface of said photo-absorption layer is a non-doped semiconductor, said channel layer is either an n-type or non-doped semiconductor, and said hole barrier layer is an n-type or non-doped semiconductor.

6. A photo-FET according to claim 1, wherein said cathode semiconductor layer comprises a substrate, a buffer layer formed on said substrate, and a step graded layer formed on said buffer layer in contact with said electron barrier layer.

7. A photo-FET according to claim 1, wherein said channel layer includes three stacked layers comprising a step graded layer in contact with said electron barrier layer, a primary channel layer above said step graded layer, and another step graded layer above said primary channel layer and under the said hole barrier layer.

8. A photo-FET according to claim 1, wherein a p-n junction gate electrode is formed between said source electrode and said drain electrode in contact with said hole barrier layer.

9. A photo-FET according to claim 1, wherein a Schottky junction gate electrode is formed between said source electrode and said drain electrode in contact with said hole barrier layer.

10. A photo-FET according to claim 1, wherein an area of said channel layer is smaller in plan than an area of said photo-absorption layer.

11. A photo-FET according to claim 1, wherein said source electrode and said drain electrode are arranged in a concentric pattern.

12. A photo-FET according to claim 1, wherein said source electrode, said gate electrode and said drain electrode are arranged in a concentric pattern.

13. A production method of a photo-FET wherein a photo-FET part is stacked on a photodiode part, comprising:
an epitaxial growth process of forming a semiconductor layer, serving as a photo-absorption layer of said photo-diode part, on a cathode semiconductor layer constituting a cathode of the photodiode part; an electron barrier layer on the photo-diode part, serving as an anode layer of said photo-diode part and constituting a semiconductor with a bandgap wider than that the photo-absorption layer; and a channel layer on the electron harrier layer constituting a channel region of said photo-FET and comprising a semiconductor with a bandgap narrower than that of the electron barrier layer; and a hole barrier layer, on said channel layer, comprising a semiconductor with a bandgap wider than that of the semiconductor constituting said channel layer, sequentially;
a process of forming a source electrode and a drain electrode, which are separated on said hole barrier layer; and
a process of cutting said channel layer in a predetermined configuration as said electron barrier layer as an etch stop layer.

* * * * *